United States Patent [19]
Sono et al.

[11] Patent Number: 5,920,117
[45] Date of Patent: Jul. 6, 1999

[54] SEMICONDUCTOR DEVICE AND METHOD OF FORMING THE DEVICE

[75] Inventors: Michio Sono; Masashi Takenaka; Masanori Yoshimoto; Tsuyoshi Aoki; Ichiro Yamaguchi; Koki Otake, all of Kawasaki, Japan

[73] Assignee: Fujitsu Limited, Kawasaki, Japan

[21] Appl. No.: 08/819,806

[22] Filed: Mar. 18, 1997

Related U.S. Application Data

[63] Continuation of application No. 08/448,262, May 23, 1995, abandoned.

[30] Foreign Application Priority Data

Aug. 2, 1994 [JP] Japan ................................. 6-181630

[51] Int. Cl.⁶ ................................................ H01L 23/495
[52] U.S. Cl. ........................ 257/675; 257/666; 257/676; 257/687; 257/706
[58] Field of Search ................................. 257/666, 675, 257/676, 693, 697, 700, 687, 706

[56] References Cited

U.S. PATENT DOCUMENTS

| | | | |
|---|---|---|---|
| 5,193,053 | 3/1993 | Sonobe | 257/676 |
| 5,216,278 | 6/1993 | Lin et al. | 257/688 |
| 5,241,133 | 8/1993 | Mullen, III et al. | 174/52.4 |
| 5,294,827 | 3/1994 | McShane | 257/676 |
| 5,355,283 | 10/1994 | Marrs et al. | 257/787 |
| 5,404,273 | 4/1995 | Akagawa | 257/713 |
| 5,455,456 | 10/1995 | Newman | 257/787 |

FOREIGN PATENT DOCUMENTS

| | | | |
|---|---|---|---|
| 0116856 | 5/1991 | Japan | 257/787 |
| 0268457 | 11/1991 | Japan | 257/666 |
| 0048756 | 2/1992 | Japan | 257/700 |
| 0129254 | 4/1992 | Japan | 257/787 |
| 0013485 | 1/1994 | Japan | 257/700 |

*Primary Examiner*—Tom Thomas
*Assistant Examiner*—Luan C. Thai
*Attorney, Agent, or Firm*—Armstrong, Westerman, Hattori, McLeland & Naughton

[57] ABSTRACT

A semiconductor device includes a board having a lower surface, a container part created in the board, external-connection nodes provided on the lower surface of the board, a supporting member provided inside the container part and secured by the board, a semiconductor chip secured on the supporting member and electrically connected with the external-connection nodes, and a sealing resin fully filling the container part so as to completely cover the semiconductor chip.

12 Claims, 14 Drawing Sheets

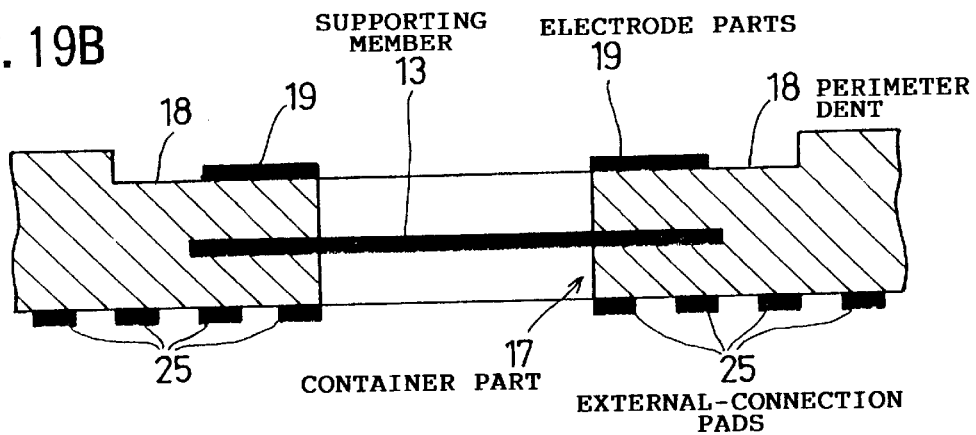
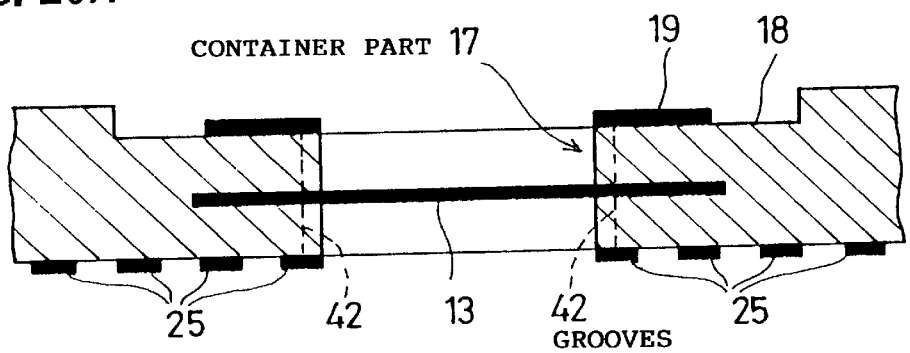
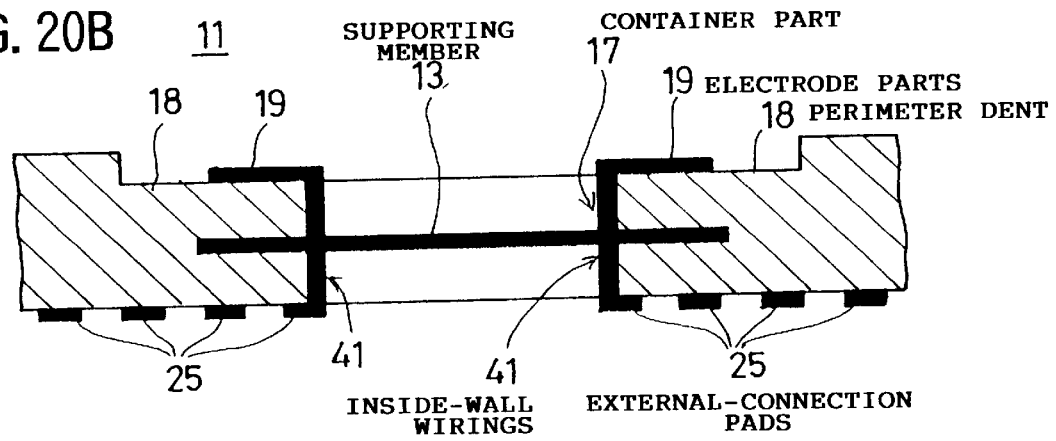

SEMICONDUCTOR DEVICE AND METHOD OF FORMING THE DEVICE

This application is a continuation of application Ser. No. 08/448,262, filed May 23, 1995, now abandoned.

BACKGROUND OF THE INVENTION

1. Field of the Invention

The present invention generally relates to semiconductor devices and methods for forming the same, and more particularly relates to a semiconductor device which has a package structure of the BGA (ball grid array) type, and a method for forming the same.

In recent years, there has been an increasing demand for semiconductor devices which can provide an increased packaging density, a higher processing speed, and greater performance. These devices are also required to be implemented in a low cost package structure.

The BGA type package structure has been developed to meet the demands described above, and is used in portable telephones and various other electronic devices.

2. Description of the Related Art

FIG. 1 shows a cross-sectional view of a semiconductor device 1 which has a plastic BGA (hereinafter referred to as PBGA) type package structure of the related art.

In FIG. 1, a printed board 2 has a multilayer structure, and a semiconductor chip 3 is fixed to a mounting surface 2a, which is the upper surface of the printed board 2. An implementing surface 2b opposite the mounting surface 2a of the printed board 2 is provided with a plurality of solder balls 4. The solder balls 4 serve as external-connection nodes.

On both the mounting surface 2a and the implementing surface 2b of the printed board 2 are formed wiring patterns 6a and 6b. The wiring pattern 6a on the mounting surface 2a is connected to the semiconductor chip 3 via wires 5. The wires 5 electrically connect the wiring pattern 6a with the semiconductor chip 3.

The wiring pattern 6a has leads on to the edges of the mounting surface 2a of the printed board 2, and, then, have leads connected to the implementing surface 2b via the side surfaces of the printed board 2. Alternatively, the wiring pattern 6b may have leads connected to the implementing surface 2b via through-holes 6c formed near the perimeter of the printed board 2. Both of these two configurations may coexist, and such a case is shown in FIG. 1. Either via the through-holes 6c or the side surfaces, the wiring pattern 6a is connected to the wiring pattern 6b on the implementing surface 2b, which is in electrical contact with the solder balls 4.

A sealing resin 7 sealing the semiconductor chip 3 is provided over the mounting surface 2a of the printed board 2. The sealing resin 7 is formed in order to protect the semiconductor chip 3, so that the semiconductor chip 3 is buried inside the sealing resin 7.

Forming the semiconductor device 1 in the PBGA structure as described above can provide a reliable implementation even when the number of leads is increased by an increase in the integration density of the semiconductor chip 3. In contrast the QFP (quad flat package) suffers from a degradation of lead strength when there is an increase in the integration density.

In the semiconductor device 1 of the PBGA structure of the related art, the semiconductor chip 3 is mounted on the mounting surface 2a of the printed board 2, and the sealing resin 7 is also mounted over the mounting surface 2a of the printed board 2. That is, the sealing resin 7 is provided only on one side (upper side) of the printed board 2 and the semiconductor chip 3. Unfortunately, this causes a problem when the semiconductor device 1 is subjected to heat in a solder reflow process.

In order to clarify this problem, thermal characteristics of the printed board 2 and the sealing resin 7 will be discussed below.

The printed board 2 is made of glass-epoxy, having a glass transition temperature of 210 (°C.), a thermal-expansion coefficient of $50 \times 10^{-6}$ (1/°C.), and a heat conductivity of $5 \times 10^{-4}$ (cal/cm·s·c). The sealing resin 7 is made of an epoxy-resin, having a glass transition temperature of 150 (°C.), a thermal-expansion coefficient of $15 \times 10^{-6}$ (1/°C.), and a heat conductivity of $20 \times 10^{-4}$ (cal/cm·s·c).

The printed board 2 and the sealing resin 7 differ in their thermal characteristics as described above. Thus, heat applied to the semiconductor device 1 in the solder reflow process at the time of manufacture results in the semiconductor device 1 being bent with edges moving upward as shown by arrows X1 in FIG. 1. This is because the thermal-expansion coefficient of the printed board 2 is larger that of the sealing resin 7. On the other hand, when the semiconductor device 1 is cooled down after the solder reflow process, the semiconductor device 1 is bent with the edges moving downward as shown by arrows X2 in FIG. 1.

In the semiconductor device 1 of the related art, differences in thermal characteristics between the printed board 2 and the sealing resin 7 will cause a bending of the printed board 2 at the time of a temperature increase or a temperature decrease during the solder reflow process. When the edges of the printed board 2 are bent upward (as shown by the arrows X1), the solder balls 4 near the edges of the printed board 2 are expanded in a vertical direction by force generated by the bend. On the other hand, the solder balls 4 around the center of the printed board 2 are contracted from the top by the force generated by the bend. In this manner, the solder balls 4 receive different kinds of force at different locations, so that it becomes difficult to realize reliable solder connections.

Also, a stress is generated by the bend, and is applied to the surface between the printed board 2 and the sealing resin 7. This stress works in such a way as to break the sealing resin 7 off the printed board 2. Thus, cracks may be created on the connecting surface between the printed board 2 and the sealing resin 7, or the sealing resin 7 can be broken off the printed board 2 when the stress is large enough.

In the semiconductor device 1 of the related art, the wiring pattern 6a has leads on to the edges or the proximity of the edges of the mounting surface 2a of the printed board 2, as described above. Then, the wiring pattern 6a is further connected by leads to the implementing surface 2b via the side surfaces of the printed board 2 or the through-holes 6c. In this configuration, the wiring length of the wiring pattern 6a becomes rather long, so that an inductance L of the wiring pattern 6a becomes large. This results in interference between each line segment of the wiring pattern 6a, which decreases performance of the semiconductor device 1. An effect of the interference is particularly strong when the semiconductor chip 3 uses signals having high frequencies for achieving a higher processing speed.

Accordingly, there is a need in the field of semiconductor devices for a semiconductor device in which a stress generated by a difference in thermal-expansion coefficients between the board and the sealing resin is reduced, and for a method for forming the same.

Also, there is a need for a semiconductor device which can improve electrical characteristics of the semiconductor device by shortening a path of a wiring pattern connecting a semiconductor chip and external-connection nodes.

SUMMARY OF THE INVENTION

Accordingly, it is a general object of the present invention to provide a semiconductor device and a method of forming the same which can satisfy the needs described above.

It is another and more specific object of the present invention to provide a semiconductor device which can reduce stress generated by a difference in thermal-expansion coefficients between the board and the sealing resin.

In order to achieve the above object, a semiconductor device according to the present invention includes a board having a lower surface, a container part created in the board, external-connection nodes provided on the lower surface of the board, a supporting member provided inside the container part and secured by the board, a semiconductor chip secured on the supporting member and electrically connected with the external-connection nodes, and a sealing resin fully filling the container part so as to completely cover the semiconductor chip.

Thus, the board is provided with the container part and the supporting member, so that the semiconductor chip can be housed in the container part and can be completely covered by the sealing resin. Thus, in this configuration, the sealing resin is not only provided on the surface of the board, but also provided in the container part.

Accordingly, when heat is applied to the semiconductor device, a stress caused by the difference in the thermal-expansion coefficients between the board and the sealing resin works as a force applied to the inside wall of the container part. That is, this stress may be a force with which the sealing resin presses the inside wall of the container part, or it may be a force which tries to separate the sealing resin from the inside wall of the container wall. Here, whether the stress is either a pulling force or a pushing force depends on the thermal-expansion coefficients of the board and the sealing resin and on whether the semiconductor device is either being heated or being cooled.

The stress caused by the difference in the thermal-expansion coefficients is applied in a direction parallel to the surface of the board, thus preventing generation of a bending moment otherwise applied to the board. Thus, there is no force applied to the external-connection nodes tending to contract or elongate them in a vertical direction, so that the external-connection nodes can be kept at the same height at the time of manufacture the semiconductor device. This results in the external-connection nodes being reliably secured on the assembly board. Also, by preventing bending of the board, cracks are not generated in either the board or the sealing resin, and the sealing resin does not break off from the board.

Also, it is still another object of the present invention to provide a semiconductor device which can improve electrical characteristics of the semiconductor device by shortening a path of the wiring pattern connecting a semiconductor chip and external-connection nodes.

In order to achieve this object according to the present invention, the board of the semiconductor device described above is comprised of a multilayer printed board which has internal wiring electrically connecting the semiconductor chip with the external-connection nodes.

In this manner, a multilayer printed board allows the wiring to be implanted inside the printed board. This leads to the electrical pathways for connecting the semiconductor chip with the external-connection nodes being shortened. The shorter pathways can lower the inductance thereof. Thus, malfunctions generated by the interference between the wiring can be prevented.

Also, it is yet another object of the present invention to provide a method for forming a semiconductor device which can reduce stress generated by a difference in thermal-expansion coefficients between the board and the sealing resin.

In order to achieve the above object, a method for forming a semiconductor device according to the present invention includes the steps of a) forming a multilayer printed board having a top surface, a bottom surface, a container part therein, a supporting member inside the container part, electrode parts formed on the top surface, and external-connection pads formed on the bottom surface and electrically connected with the electrode parts, b) securing a semiconductor chip on the supporting member inside the container part, c) electrically connecting the semiconductor chip with the electrode parts, d) filling a sealing resin into the container part so as to fully cover the semiconductor chip, and e) attaching external-connection nodes on the external-connection pads, wherein step a) comprises the steps of a1) forming conductive metal patterns on the printed board single layers, the conductive metal patterns including the electrode parts and the external-connection pads, a2) forming a hole through the printed board single layers, a3) stacking the printed board single layers with the supporting member being inserted therebetween, and a4) fixedly connecting the printed board single layers together.

Thus, the multilayer printed board is formed by first creating printed board single layers having a hole where the semiconductor chip is to be held. Then, the printed board single layers are stacked one over another with the supporting member being inserted to a predetermined position, and, then, are connected together. Thus, the container part for housing the semiconductor chip can be readily formed, and the supporting member can be arranged at an appropriate position without any difficulty. Also, in the semiconductor device thus formed, the stress caused by the difference in the thermal-expansion coefficients between the multilayer printed board and the sealing resin is applied in a direction parallel to the surface of the multilayer printed board. This results in the multilayer printed board being prevented from bending.

Also, it is still another object of the present invention to provide a semiconductor device which can improve electrical characteristics of the semiconductor device by shortening the wiring pattern path connecting a semiconductor chip and external-connection nodes.

Other objects and further features of the present invention will be apparent from the following detailed description when read in conjunction with the accompanying drawings.

BRIEF DESCRIPTION OF THE DRAWINGS

FIGS. 19A and 19B are process charts showing a process of forming the multilayer printed board used for the present invention;

FIGS. 20A and 20B are process charts showing a process of forming the inside-wall wiring in the multilayer printed board;

DESCRIPTION OF THE PREFERRED EMBODIMENTS

In the following, embodiments of the present invention will be described with reference to the accompanying drawings.

Figure 2:
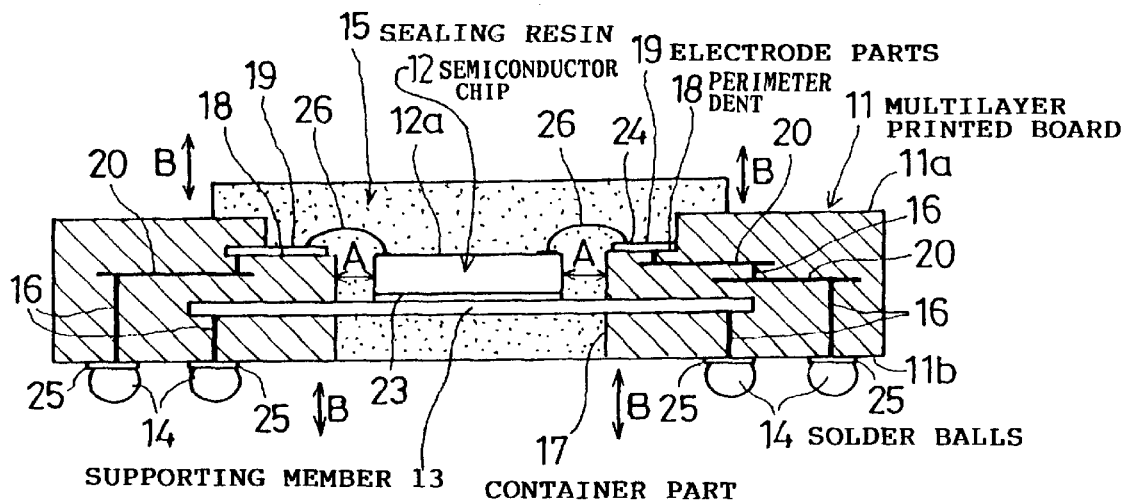
FIG. 2 is a cross-sectional view of a semiconductor device according to a first embodiment of the present invention.
Figure 3:
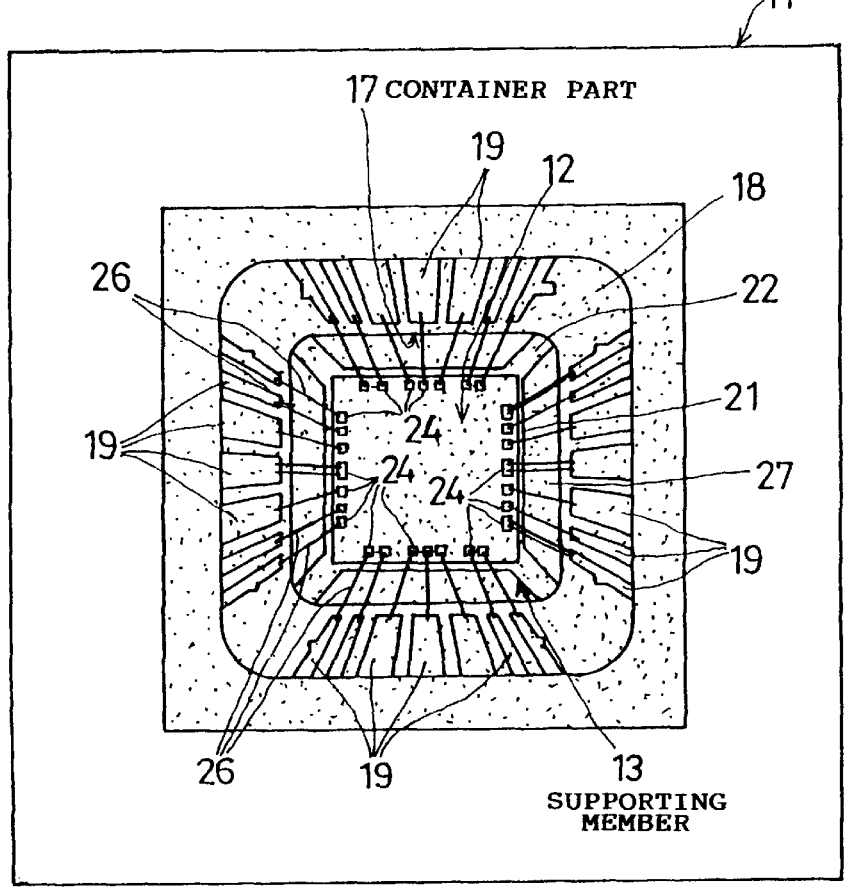
FIG. 3 is a sectional plan view of the semiconductor device of FIG. 2.

FIG. 2 shows a cross-sectional view of a semiconductor device 10 of a first embodiment according to the present invention. FIG. 3 shows a sectional plan view of the semiconductor device 10.

The semiconductor device 10 includes a multilayer printed board 11, a semiconductor chip 12, a supporting member 13, solder balls 14, and a sealing resin 15.

Figure 1:
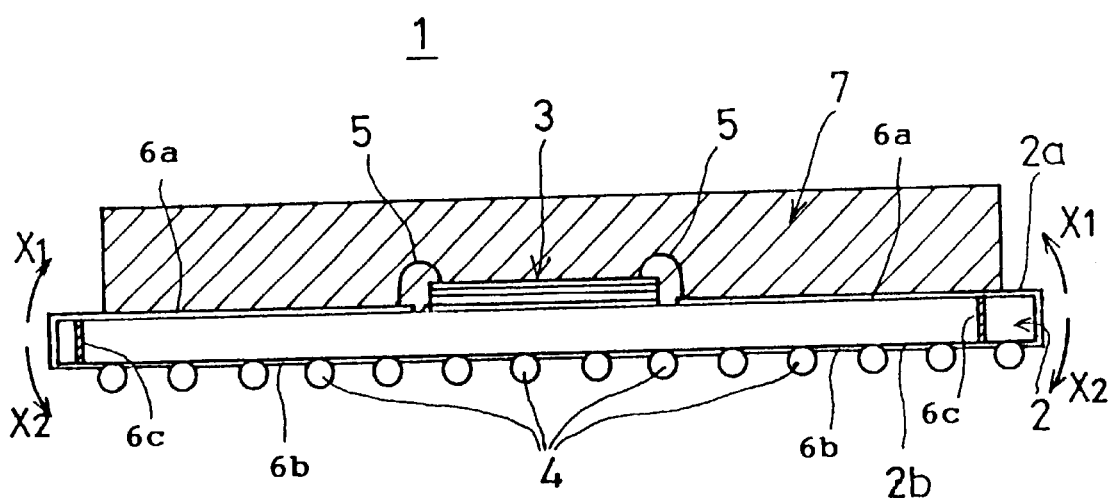
FIG. 1 is a cross-sectional view of a semiconductor device of the related art.

The multilayer printed board 11 is formed by a plurality of single-layer printed boards made of glass-epoxy stacked one upon another. (FIG. 1 shows the multilayer printed board 11 as one element rather than as a pile of layers.) A material used for the multilayer printed board 11 is not different from that used in the related art. Thus, thermal characteristics of the multilayer printed board 11 are the same as those cited earlier. That is, a glass transition temperature is 210 (°C.), a thermal-expansion coefficient is $50 \times 10^{-6}$ (1/°C.), and a heat conductivity is $5 \times 10^{-4}$ (cal/cm·s·c).

Each of the single-layer printed boards forming the multilayer printed board 11 has a predetermined wiring pattern printed on a surface thereof. Stacking the single-layer printed boards results in the wiring patterns, once formed on a surface, being buried in the multilayer printed board 11. Through-holes 16 provide electrical connections between these wiring patterns in the multilayer printed board 11. The through-holes 16 are formed by creating holes through some of the single-layer printed boards and plating inside walls thereof with copper.

A container part 17 is formed at the center of the multilayer printed board 11 to contain the semiconductor chip 12 therein. Actually, the container part 17 is a hole created through the multilayer printed board 11 at the center thereof. Around the container part 17, a step is created down from an upper surface 11a of the multilayer printed board 11, and is hereinafter referred as a perimeter dent 18. On a surface of the perimeter dent 18 is provided an electrode part 19.

The supporting member 13 is formed of, for example, copper, copper alloy, or a lead material such as 42 alloy, all of which are conductive metals. The supporting member 13 includes a die-pad portion 21 and supporting bars 22. The die-pad portion 21 is used for mounting the semiconductor chip 12, and the supporting 22 are buried into the multilayer printed board 11 so that the die-pad portion 21 is provided with a sturdy support. Actually, the die-pad portion 21 is a portion of the supporting member 13 which is inside the container part 17. The semiconductor chip 12 is fixed on the die-pad portion 21 of the supporting member 13 with a die-bonding material 23.

The semiconductor chip 12 fixed by the supporting member 13 is held inside the container part 17 of the multilayer printed board 11. At this position, an upper surface 12a of the semiconductor chip 12 is generally flush with or slightly lower than the upper surface 11a of the multilayer printed board 11.

The solder balls 14 serve as external-connection nodes, and are connected to an assembly board on which the semiconductor device 10 is mounted. The solder balls 14 are mounted on external-connection pads 25 which are formed on the mounting surface 11b of the multilayer printed board 11. The external-connection pads 25 are formed from a material which exhibits a good affinity with solder and copper used for the through-holes 16.

Electrode pads 24 are formed on the upper surface 12a of the semiconductor device 12. The electrode pads 24 are electrically connected with electrode parts 19 formed on the perimeter dent 18 via wires 26. This configuration which uses the wires 26 for connecting the electrode pads 24 with the electrode parts 19 enables reliable wire connections between the semiconductor device 12 and the electrode parts 19. This is because such a configuration makes the electrode parts 19 closer to the electrode pads 24, even though the semiconductor device 12 is contained in the container part 17 formed on the multilayer printed board 11.

The electrode parts 19 connected with the semiconductor, chip 12 are routed to the mounting surface 11b of the multilayer printed board 11 by the through-holes 16 and internal wiring 20. In this manner, the electrode parts 19 are electrically connected with the external-connection pads 25. The semiconductor chip 12 and the solder balls 14 are electrically connected with each other through the wires 26, the electrode parts 19, the through-holes 16, the internal wiring 20, and the external-connection pads 25.

In this manner, the through-holes 16 and the internal wiring 20 inside the multilayer printed board 11 are used for coupling the semiconductor chip 12 and the solder bolls 14. This configuration simplifies the designing of the wiring patterns, and realizes short wiring paths for connecting the semiconductor chip 12 and the solder balls 14. Thus, inductance of the wiring coupling the semiconductor chip 12 and the solder balls 14 can be reduced, so that malfunctions caused by interference between the wiring can be prevented.

In this embodiment, the supporting member 13 is formed from a conductive material to be used as wiring for electrical connections. For example, a ground electrode can be connected to a back surface of the semiconductor chip 12, and can be electrically connected with the supporting member 13 with die-bonding material 23 exhibiting an electrical conductivity. In this manner, the supporting member 13 can be used as a ground wiring. The electrical connection between the supporting member 13 and the solder balls 14 can be provided by the through-holes 16. The use of the supporting member 13 as a path for an electrical connection realizes a simple wiring pattern for the electrical connection. Also, inductance of the supporting member 13 is less than that of the internal wiring 20, formed inside the multilayer printed board 11, so that an electrical characteristic of the semiconductor device 10 is enhanced.

The sealing resin 15 is provided inside the container part 17 so as to cover the semiconductor chip 12 as well as the supporting member 13. The material used for the sealing resin 15 is the same as that used in the related art, and epoxy-resin, for example, may be used. Thermal characteristics of the epoxy-resin are a glass transition temperature of 150 (°C.), a thermal-expansion coefficient of $15 \times 10^{-6}$ (1/°C.), and a heat conductivity of $20 \times 10^{-4}$ (cal/cm·s·c). Accordingly, as in the related art, the semiconductor device 10 of this embodiment exhibits a difference in the thermal-expansion coefficients between the multilayer printed board 11 and the sealing resin 15. Here, stress caused by the difference in the thermal-expansion coefficients between the multilayer printed board 11 and the sealing resin 15 will be considered below.

As described above, in the semiconductor device 10 of this embodiment, the semiconductor chip 12 is supported by the supporting member 13 in the container part 17 formed inside the multilayer printed board 11. The sealing resin 15 is provided to cover the semiconductor chip 12 as well as the supporting member 13. In this configuration, the sealing resin 15 is not only provided on a surface of the multilayer printed board 11, but also provided inside the container part 17, which is a hole formed through the multilayer printed board 11.

Accordingly, when heat is applied to the semiconductor device 10 at the time of soldering the solder balls 14 with the assembly board, stress caused by the difference in the thermal-expansion coefficients between the multilayer printed board 11 and the sealing resin 15 works as a force applied to an inside wall of the container part 17. That is, this stress may be a force with which the sealing resin 15 presses against the inside wall of the container part 17, or it may be a force which tries to separate the sealing resin 15 from the inside wall of the container wall. In other words, this stress may be a force with which the inside wall of the container part 17 presses the sealing resin 15, or may be a force with which the inside wall of the container part 17 tries to break away from the sealing resin 15. Here, whether the stress is either a pulling force or a pushing force depends on the thermal-expansion coefficients of the multilayer printed board 11 and the sealing resin 15 and on whether the semiconductor device 10 is either being heated or being cooled.

The stress generated between the container part 17 and the sealing resin 15 is shown by arrows A in FIG. 2. As is indicated by the arrows A in FIG. 2, the stress caused by the difference in the thermal-expansion coefficients between the multilayer printed board 11 and the sealing resin 15 is applied in a direction parallel to a surface of the multilayer printed board 11. A stress in a direction B perpendicular to the surface of the multilayer printed board 11 is non-existent, or very little if it exists. Thus, even though there is a difference in the thermal-expansion coefficients between the multilayer printed board 11 and the sealing resin 15, the multilayer printed board 11 is not bent when heat is applied.

Since the multilayer printed board 11 is not bent when heat is applied to the semiconductor device 10 at the time of manufacture, the solder balls 14 are not subjected to forces to compress them or expand them in the vertical direction. Thus, the solder balls 14 can be kept at the same height, which leads to reliable connections between the solder balls 14 and the assembly board. Also, the fact that the multilayer printed board 11 is not bent means that there will be no cracks generated in the multilayer printed board 11 and the sealing resin 15. Nor will there be breaking off of the sealing resin 15 from the multilayer printed board 11. Furthermore, since the sealing resin 15 does not generate cracks, humidity resistance thereof is enhanced. This leads to prevention of such accidents is the destruction of the semiconductor chip 12 caused by steam-pressure which build up inside the semiconductor chip 12.

As is clear from the description provided above, the semiconductor chip 12 as well as the supporting member 13 should be completely covered by the sealing resin 15, in order to prevent the multilayer printed board 11 from bending. In other words, it is critical to completely fill the container part 17 with the sealing resin 15. In general, in BGA-package-type semiconductor devices in which the solder balls 14 are provided on the mounting surface 11b of the multilayer printed board 11, the sealing resin is filled by a potting process. Thus, in order to ensure that the sealing resin 15 completely fills the container part 17, the semiconductor device 10 must be in such a configuration that the sealing resin 15 can be filled in a space on the back side of the supporting member 13.

Figure 4:
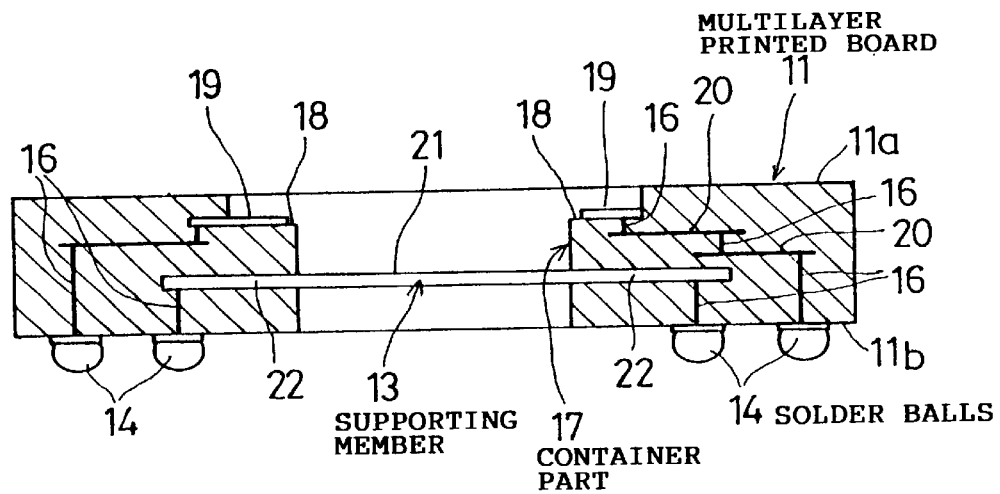
FIG. 4 is a cross-sectional view of the semiconductor device of FIG. 2 in which a sealing resin and a semiconductor device of FIG. 2 are not provided for the clarity of the figure.
Figure 5:
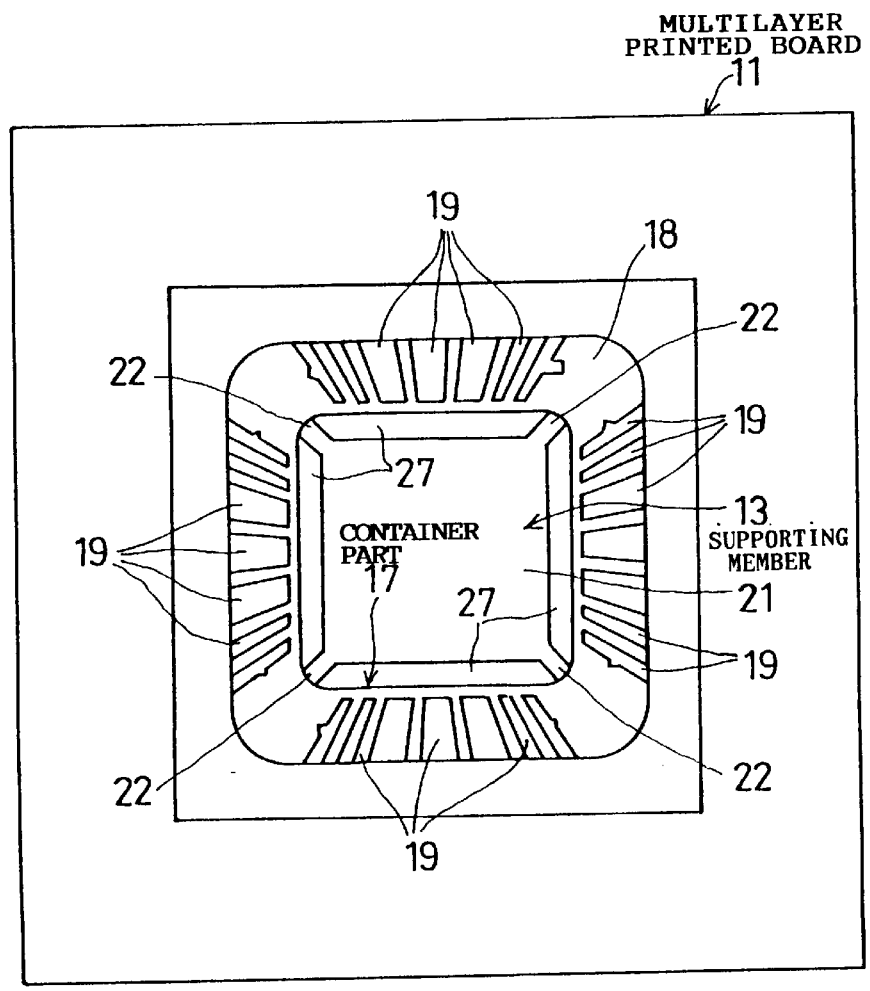
FIG. 5 is a sectional plan view of the semiconductor device of FIG. 2 in which a sealing resin and a semiconductor device of FIG. 2 are not provided for clarity of the figure.

FIG. 4 shows a cross-sectional view of the semiconductor device 10 without the sealing resin 15 present solely for explanatory purposes. FIG. 5 shows a sectional plan view of the semiconductor device 10 also without the sealing resin 15 present.

With reference to FIG. 4, in order to fully fill the container part 17 with a sealing resin, some pathways should be formed through the supporting member 13 so as to allow the sealing resin poured from the above to enter a lower chamber of the container part 17. Thus, the supporting member 13 of the semiconductor device 10 is provided with resin-pathway holes 27 as shown in FIG. 5. Here, since the resin-pathway holes 27 are created, the die-pad portion 21 becomes smaller than an aperture size of the container part 17. Through the resin-pathway holes 27, the sealing resin 15 can enter and fill the lower chamber of the container part 17, i.e., the space on the back side of the supporting member 13.

However, since the resin-pathway holes 27 shown in FIG. 5 are provided at a perimeter of the die-pad portion 21, it is possible that the sealing resin 15 does not get around to the back surface of the supporting member 13. Thus, a shape of the die-pad portion 21, i.e., a shape of the resin-pathway holes 27, may be changed to an appropriate shape to enlarge the size of the resin-pathway holes 27, so that the sealing resin 15 can fully fill the lower chamber of the container part 17.

FIGS. 6A to 6E are partial sectional plan views of the semiconductor device 10 showing examples of varied shapes of the die-pad portion 21 in order to ensure that the sealing resin 15 gets into the lower chamber of the container part 17.

Figure 6A:
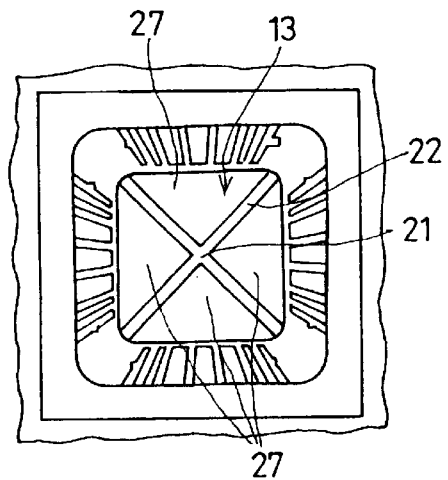
FIGS. 6A to 6E are partial sectional plan views of variations of the semiconductor device of FIG. 2.
Figure 6B:
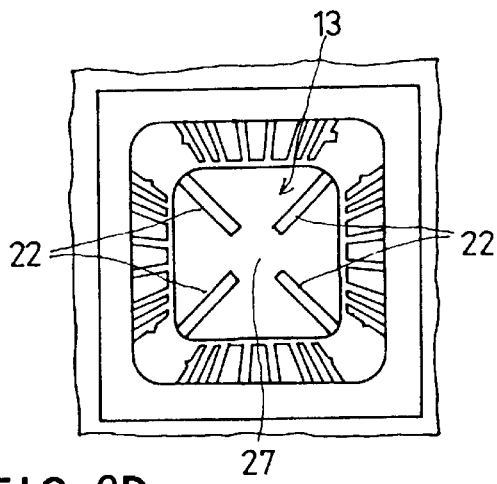
Figure 6C:
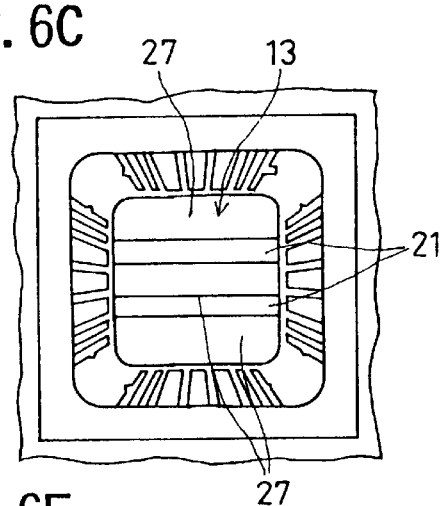
Figure 6D:
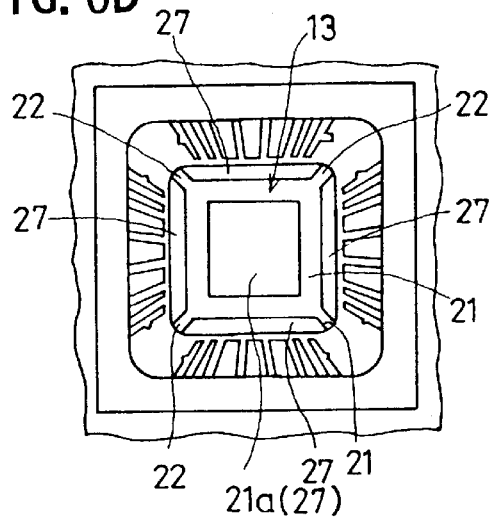
Figure 6E:
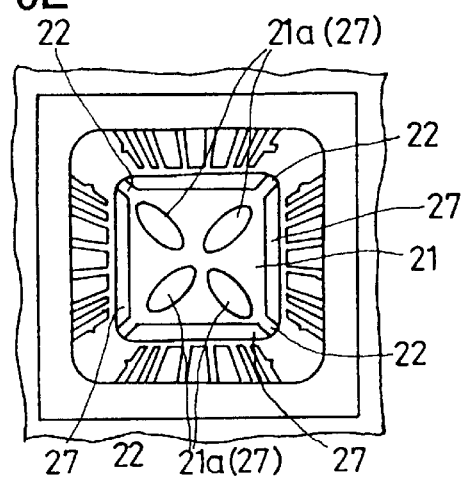

FIG. 6A shows an example in which the die-pad portion 21 is formed by supporting bars 22 which cross at the center, so that the size of the resin-pathway holes 27 are large. FIG. 6B shows an example in which the supporting bars 22 extend from the perimeter enough to support the semiconductor chip 12 but do not cross at the center. FIG. 6C shows an example in which the die-pad portion 21 is formed by two parallel bars. FIG. 6D shows an example in which the die-pad portion 21 of FIG. 4 has a hole 21a at the center thereof, which is also used as the resin-pathway holes 27. FIG. 6E shows an example in which the die-pad portion 21 of FIG. 5 has a plurality of holes 21a, which are also used as the resin-pathway holes 27. Configurations of enlarging a size of the resin-pathway holes 27 are not limited to the above examples, but various variations can be made.

Figure 7:
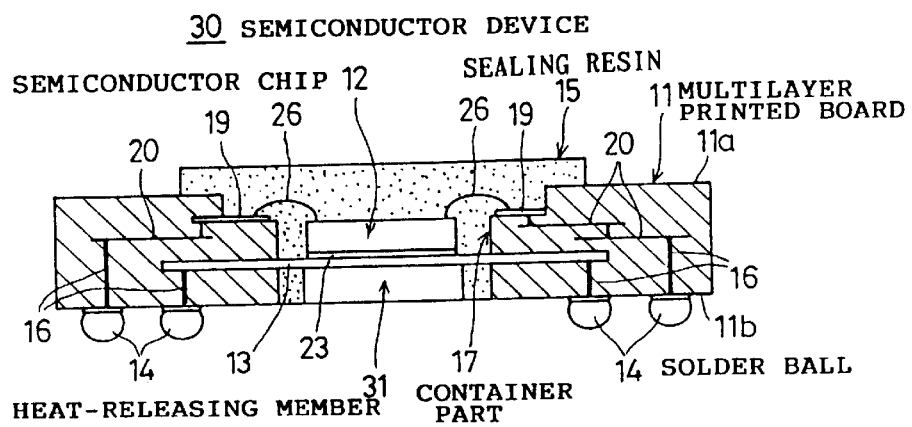
FIG. 7 is a cross-sectional view of a semiconductor device according to a second embodiment of the present invention.

FIG. 7 shows a cross-sectional view of a semiconductor device 30 of a second embodiment of the present invention. In FIG. 7, the same elements as those of FIG. 2 are referred to by the same numerals, and a description thereof will be omitted.

The semiconductor device 30 shown in FIG. 7 is provided with a heat-releasing member 31 beneath the supporting member 13. The heat-releasing member 31 has a block shape, and is formed from such a high heat-conductivity material as copper, aluminium, etc. An upper surface of the heat-releasing member 31 is in contact with the back surface of the supporting member 13, so that there is a thermal connection between these two. A lower surface of the heat-releasing member 31 is not covered by the sealing resin 15 and is exposed to the air.

In the semiconductor device 30, heat generated by the semiconductor chip 12 is conducted to the heat releasing member 31 via the supporting member 13. Since the heat-releasing member 31 is formed from a high heat-conductivity material as described above, the heat is further conducted to the lower surface of the heat-releasing member 31 which is exposed to the air. Thus, the heat can be released from the lower surface. In this manner, the use of the heat-releasing member 31 can enhance a cooling efficiency of the semiconductor device 30.

The semiconductor device 30 which is provided with the heat-releasing member 31 also has a configuration in which the sealing resin 15 is filled inside the container part 17. Thus, when heat is applied to the semiconductor device 30, the stress caused by the difference in the thermal-expansion coefficients between the multilayer printed board 11 and the sealing resin 15 is applied in a direction parallel to the surface of the multilayer printed board 11. This means that the multilayer printed board 11 is not bent because of the applied heat.

Figure 8:
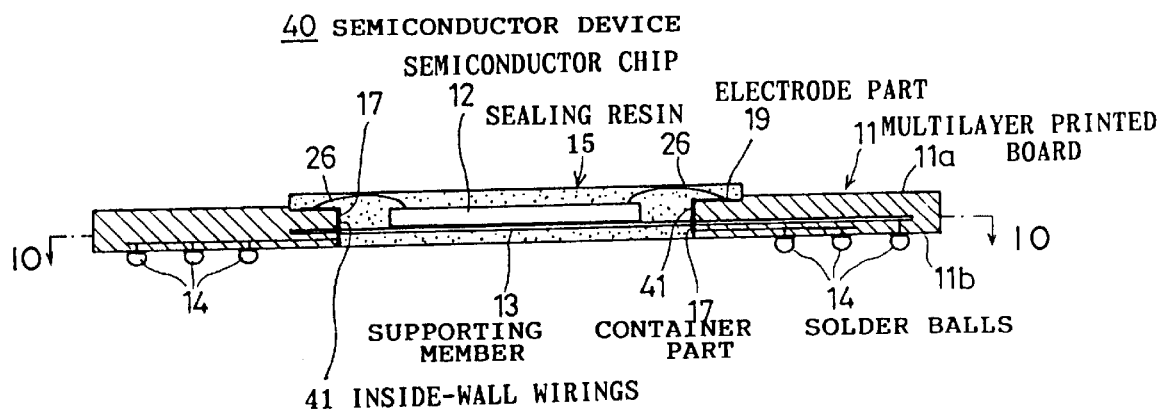
FIG. 8 is a cross-sectional view of a semiconductor device according to a third embodiment of the present invention.
Figure 9:
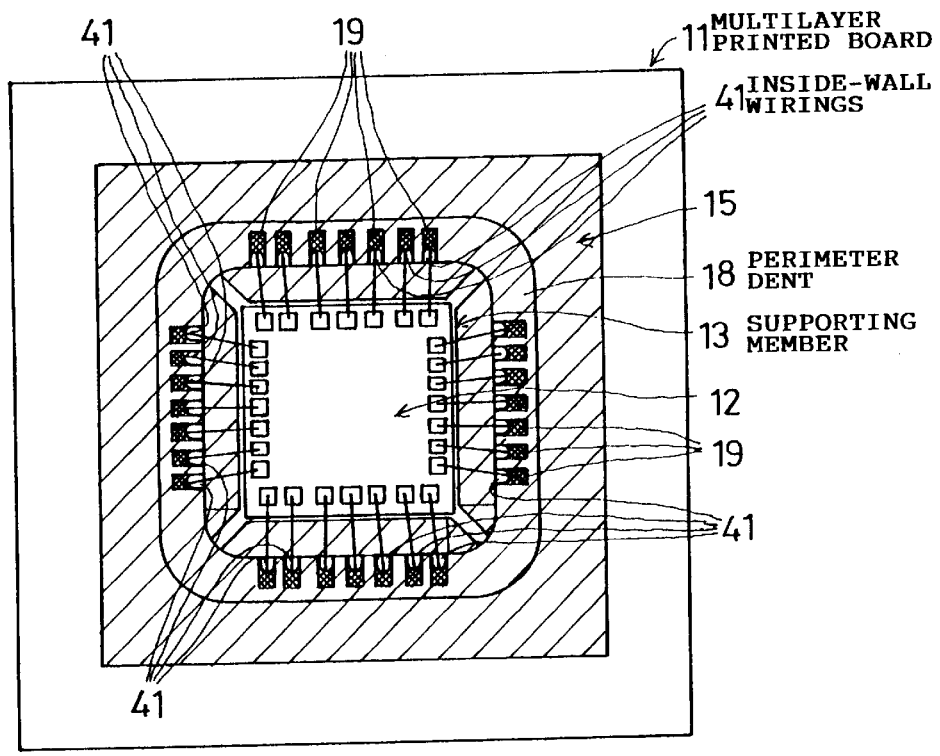
FIG. 9 is a sectional plan view of the semiconductor device of FIG. 8.
Figure 10:
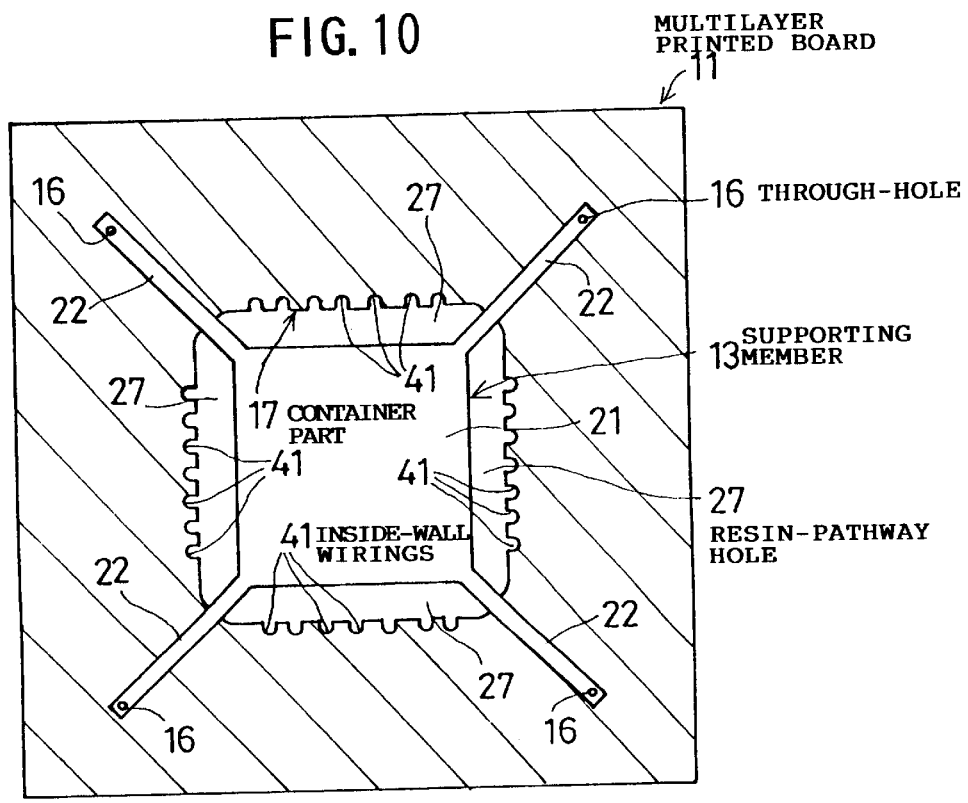
FIG. 10 is a sectional plan view of the semiconductor device of FIG. 8 taken along a line 10—10 of FIG. 8.

FIG. 8 through FIG. 10 show a semiconductor device 40 of a third embodiment of the present invention. FIG. 8 shows a cross-sectional view of the semiconductor device 40, and FIG. 9 shows a plane view thereof. FIG. 10 shows a sectional view of the semiconductor device 40, which is taken along a line 10—10 of FIG. 8. In those figures, the same elements as those in FIG. 2 through FIG. 5 are referred to by the same numerals, and a description thereof will be omitted.

In the semiconductor device 10 of the first embodiment, the electrical connections between the semiconductor chip 12 and the solder balls 14 are provided by the through-holes 16 and the internal wiring 20 formed inside the multilayer printed board 11. As noted earlier, this configuration allows a simple layout of the wiring, and can shorten the path length of electrical connections. However, in this configuration of the semiconductor device 10 of the first embodiment, there is a need to form the through-holes 16 and the internal wiring 20 inside the multilayer printed board 11. Thus, manufacturing of the multilayer printed board 11 becomes complicated, and the yield tends to be reduced.

The semiconductor device 40 of the third embodiment is characterized in that inside-wall wiring 41 is provided to electrically connect the semiconductor chip 12 and the solder balls 14. The inside-wall wiring 41 include grooves 42 formed on the inside wall of the container part 17 and conductive member 43 (e.g, a copper layer) provided in the grooves 42.

Figure 11:
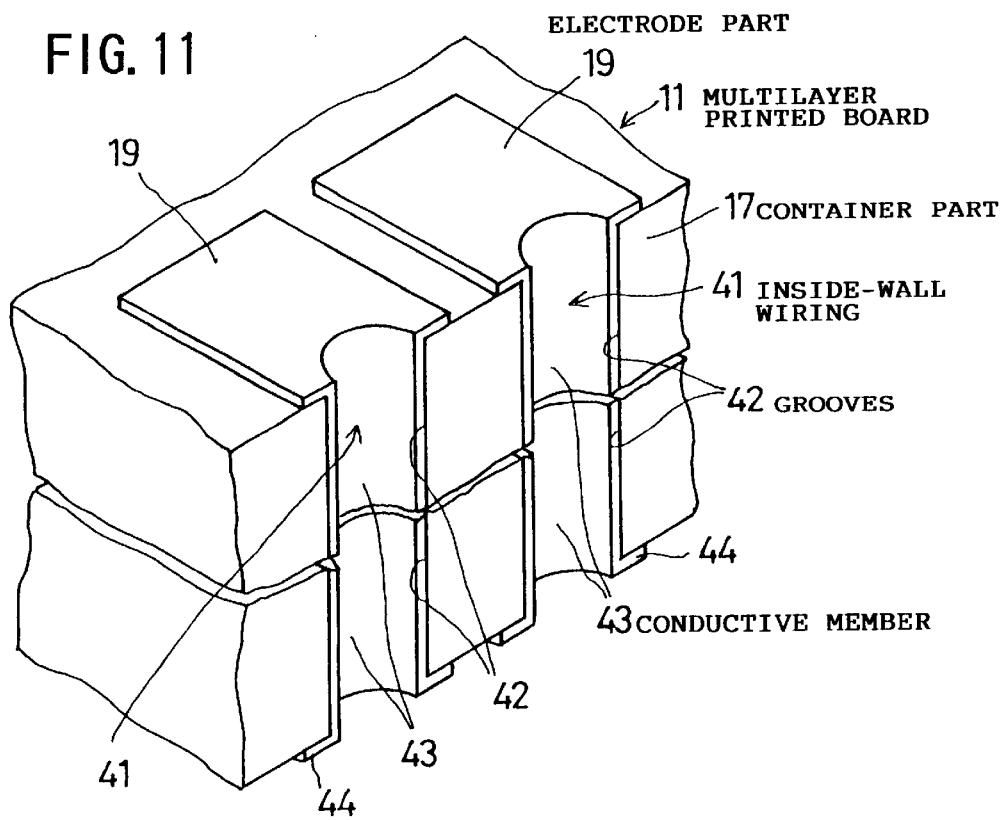
FIG. 11 is an enlarged partial view of an inside-wall wiring of the semiconductor device of FIG. 8.

As shown in FIG. 11, an upper end of the conductive member 43 is coupled to the electrode parts 19 formed on the perimeter-dent 18. Also, a lower end of the conductive member 43 is coupled to a wiring pattern 44, which is formed on the lower surface of the multilayer printed board 11 and is connected to the external-connection pads 25.

The use of the inside-wall wiring 41 formed on the inside wall of the container part 17 makes it unnecessary to extend the wiring pattern 6 to the perimeter of the printed board 2 in order to couple the semiconductor chip 3 with the solder balls 4 as shown in FIG. 1. That is, in the semiconductor device 40 of the third embodiment, paths connecting the semiconductor chip 12 and the solder balls 14 can be shortened by the inside-wall wiring 41 utilizing the hole, i.e., the container part 17, created through the multilayer printed board 11. This results in the paths connecting the semiconductor chip 12 with the solder balls 14 having a lower inductance. The reduction of the inductance means a higher processing speed of the semiconductor device 40.

Also, the inside-wall wiring arrangement 41 includes the grooves 42 formed on the inside wall of the container part 17 and the conductive member 43 provided in the grooves 42. Thus, the inside-wall wiring 41 can be easily formed. Specifically, such a simple method as a plating technique can be used for creating the conductive member 43. This leads to an efficient manufacturing technique for the inside-wall wiring 41 and permits increased production.

Also, since the conductive member 43 is provided inside the grooves 42, it does not stick out from the inside wall of the container part 17. Thus, the conductive member 43 does not hinder the progress of the sealing resin 15 when it fills the container part 17.

In the third embodiment, the supporting member 13 is made of a conductive member the same as in the previous embodiments, and has a configuration in which the supporting bars 22 extend into the multilayer printed board 11 as shown in FIG. 10. The electrical connection between the supporting member 13 and the solder balls 14 is provided through the through-holes 16 formed inside the multilayer printed board 11. However, this configuration uses the extended supporting bars 22 as part of pathways for the electrical connection, so that the inductance of the pathways cannot be sufficiently reduced.

Figure 12:
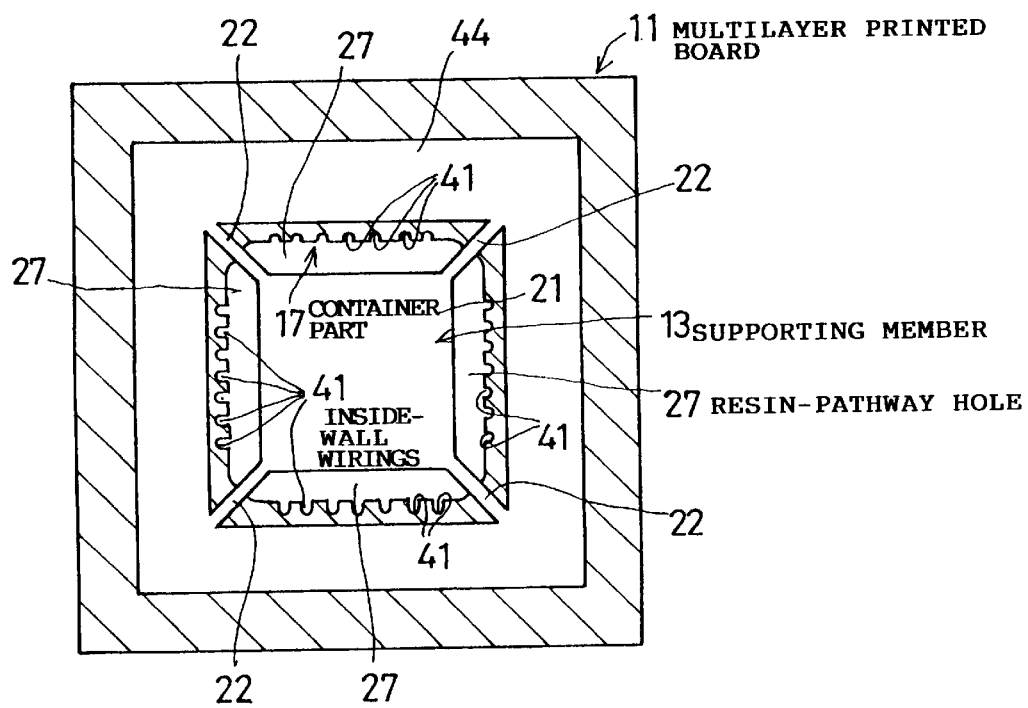
FIG. 12 is a sectional plan view of a variation of the semiconductor device of FIG. 8.

FIG. 12 shows a variation of the semiconductor device 40 of the third embodiment. In FIG. 12, an internal wiring layer 45 having a large area extending into the multilayer printed board 11 is provided, and is connected to the supporting member 13. The internal wiring layer 45 has a large area and a low inductance, and, also, can come close to the container part 17 so that the supporting bars 22 can be shortened. Thus, there is also a reduction in the inductance of the supporting bars 22.

The electrical connection between the internal wiring layer 45 and the solder balls 14 is implemented by the through holes. Since the internal wiring layer 45 has a large area, there is a wide scope for deciding locations of the through-holes. Also, the supporting member 13 and the internal wiring layer 45 can be formed integrally so as to reduce the number of steps in the manufacturing process.

Figure 13:
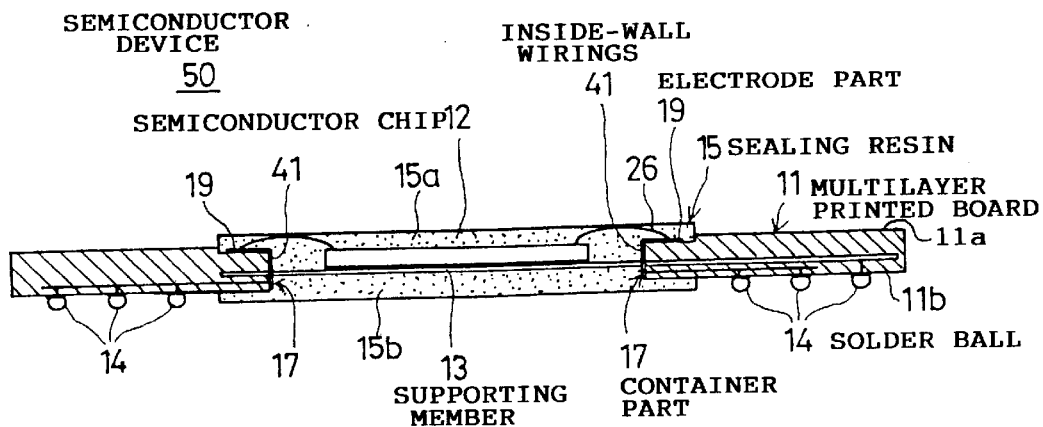
FIG. 13 is a cross-sectional view of a semiconductor device according to a fourth embodiment of the present invention.

FIG. 13 shows a semiconductor device 50 of a fourth embodiment of the present invention. In the figure, the same elements as those in FIG. 8 through FIG. 10 are referred to by the same numerals, and a description thereof will be omitted.

In the semiconductor devices 10 and 40 of the first and third embodiments, respectively, the sealing resin 15 extends out from the upper surface 11a of the multilayer printed board 15. When the sealing resin 11 is formed by the potting process, it is difficult to prevent the resin from extending out from the upper surface 11a of the multilayer printed board 11.

Unfortunately, the extra portion of the sealing resin 15 which extends out from the upper surface 11a of the multilayer printed board 11 can be a cause of creating a bend of the multilayer printed board 15. That is, the extra portion of the sealing resin 11 works in the same manner as the sealing resin 7 of the semiconductor device 1 of FIG. 1, which causes a bend of the printed board 2 when heat is applied to the semiconductor device 1.

In the semiconductor device 40 of the fourth embodiment, the sealing resin 15 is provided such that it extends out not only from the upper surface 11a of the multilayer printed board 11, but also from the mounting surface 11b. The upper extra portion of the sealing resin 15 is referred to by reference numeral 15a, and the lower extra portion by 15b as shown in FIG. 13. In this manner, the extra portion 15b extending out from the mounting surface 11b provides a configuration in which the multilayer printed board 11 is placed between the extra portions 15a and 15b.

In this configuration, the sealing resin 15 is provided in a generally symmetric form on both the upper side and the lower side of the multilayer printed board 11. In other words, the sealing resin 15 is balanced between the upper side and the lower side of the multilayer printed board 11.

Accordingly, when the semiconductor device 50 is subject to heat, the stress caused by the difference in the thermal-expansion coefficients between the sealing resin 15 and the multilayer printed board 11 can be balanced between the lower side and the upper side. That is, the stress originating from the extra portion 15a is of the same magnitude as and in the opposite direction to that originating from the extra portion 15b. Thus, the stress applied to the surface 11a of the multilayer printed board 11 and the stress applied to the mounting surface 11b are canceled by each other. The balance of these stresses can prevent the multilayer printed board 11 from bending.

Figure 14:
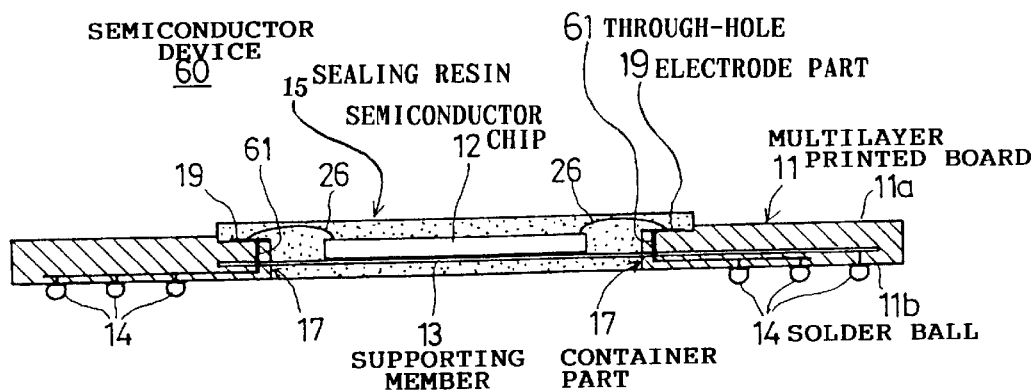
FIG. 14 is a cross-sectional view of a semiconductor device according to a fifth embodiment of the present invention.

FIG. 14 shows a semiconductor device 60 of a fifth embodiment of the present invention. In the figure, the same elements as those in FIG. 8 through FIG. 10 are referred to by the same numerals, and a description thereof will be omitted.

In the semiconductor device 40 of the third embodiment shown in FIG. 8, the semiconductor chip 12 and the solder balls 14 are connected through the inside-wall wiring 41 formed on the inside wall of the container part 17.

On the other hand, in the semiconductor device 60 of the fifth embodiment, paths connecting between the semiconductor chip 12 and the solder balls 14 are provided by the through-holes 61. Locations for creating the through-holes 61 are selected from areas closer to the container part 17 than locations for the wire-bonding of the wires 26 to the electrode parts 19.

In this manner, the through-holes 61 created closer to the container part 17 than the locations of the wire-bonding of the wires 26 can provide short paths connecting the semiconductor chip 12 with the solder balls 14. Thus, the inductance of the paths can be reduced, whereby electrical characteristics of the semiconductor device 60 can be enhanced. (Especially, processing speed can be increased.)

Figure 15:
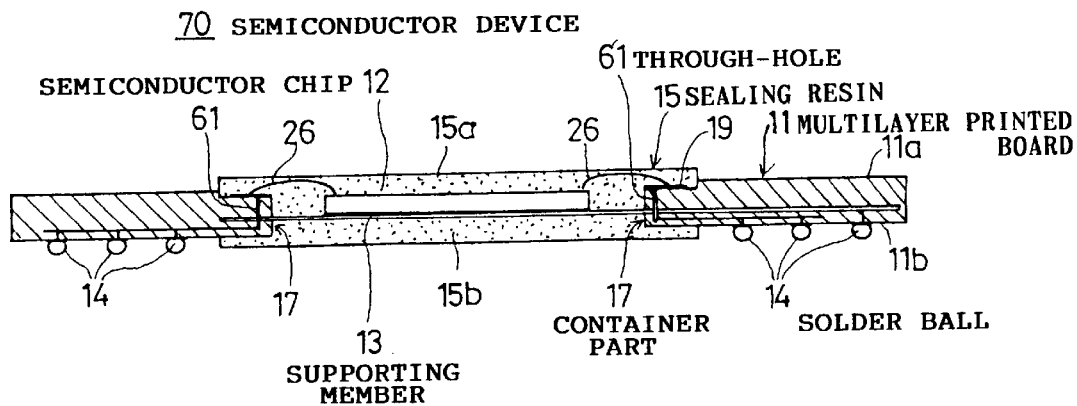
FIG. 15 is a cross-sectional view of a semiconductor device according to a sixth embodiment of the present invention.

FIG. 15 shows a semiconductor device 70 of a sixth embodiment of the present invention. In the figure, the same elements as those in the previous embodiments are referred to by the same numerals, and a description thereof will be omitted.

The semiconductor device 70 of the sixth embodiment is a combination of the semiconductor device 50 of the fourth embodiment and the semiconductor device 60 of the fifth embodiment. Specifically, the semiconductor device 70 of the sixth embodiment differs from the semiconductor device 60 of the fifth embodiment only in that the sealing resin 15 pokes out not only from the upper surface 11a of the multilayer printed board 11 but also from the mounting surface 11b. Thus, according to the sixth embodiment, the multilayer printed board 11 can be prevented from bending when heat is applied.

In the following, a method of forming semiconductor devices of the present invention will be described.

Figure 16:
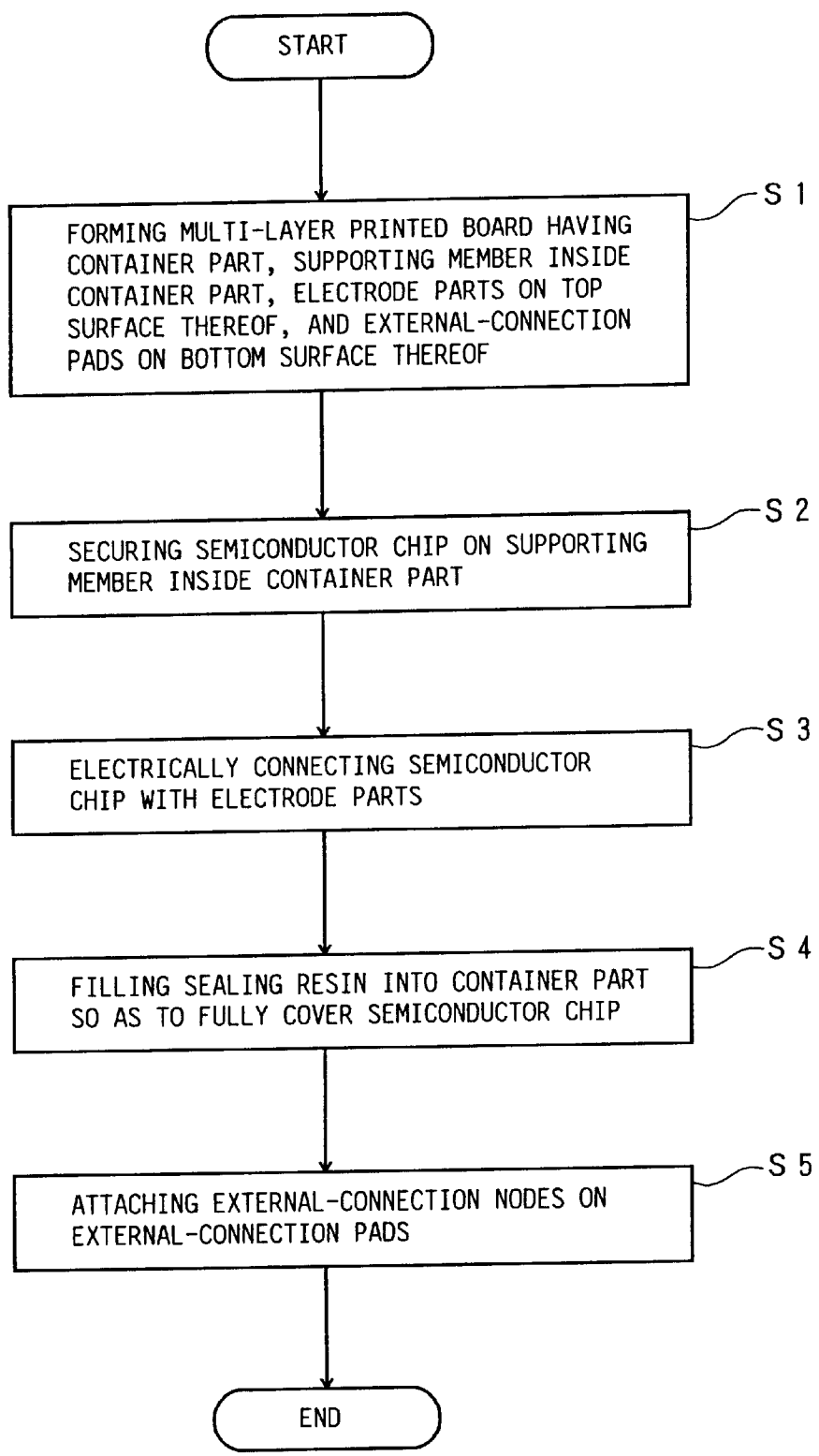
FIG. 16 is a flowchart of a process of forming a semiconductor device according to the present invention.

FIG. 16 shows a flowchart of a process of forming the semiconductor device according to the present invention.

At a step S1, a multilayer printed board is formed, which has a container part therein, a supporting member inside the container part, electrode parts on the top surface thereof, and external-connection pads on the bottom surface thereof. A process for forming the multilayer printed board will be described later in detail.

At a step S2, a semiconductor chip is secured on the supporting member inside the container part.

At a step S3, the semiconductor chip is electrically connected to the electrode parts formed on the top surface of the multilayer printed board.

At a step S4, a sealing resin is filled into the container part so as to fully cover the semiconductor chip.

At a step S5, external-connection nodes are attached on the external-connection pads formed on the bottom surface of the multilayer printed board.

In the manner as delineated by these steps, the semiconductor device is formed such that it has the semiconductor chip in the container part and the sealing resin fully filled in the container part. Thus, the semiconductor device formed by these steps can be prevented from bending when it is heated.

These steps for forming the semiconductor chip according to the present invention will be described below in detail. Here, specifically, a process of forming the semiconductor device 40 of the third embodiment will be described as an example. Also, in the description below, the same elements as those of FIG. 8 through FIG. 10 are referred to by the same numerals.

The multilayer printed board 11 used in the present invention is comprised of three printed board single layers which are stacked one on another. Thus, in order to form the multilayer printed board 11, each of the printed board single layers should be formed first.

FIGS. 17A through 17E show a process of forming a printed board single layer 81 which is used as the top layer of the multilayer printed board 11.

Figure 17A:
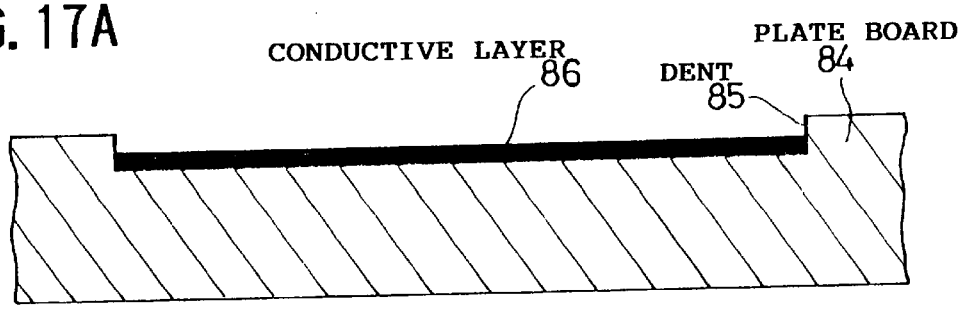
FIGS. 17A to 17E are process charts showing a process of forming a printed board single layer into such a shape that is used for a multilayer printed board for the present invention.

As shown in FIG. 17A, a dent 85 is first formed on an upper surface of a plate board 84 which is made of glass-epoxy. Then, a conductive member such as copper is placed in the dent 85 to form a conductive layer 86. For creating the conductive layer 86, a plating method or a printing method can be employed.

Figure 17B:
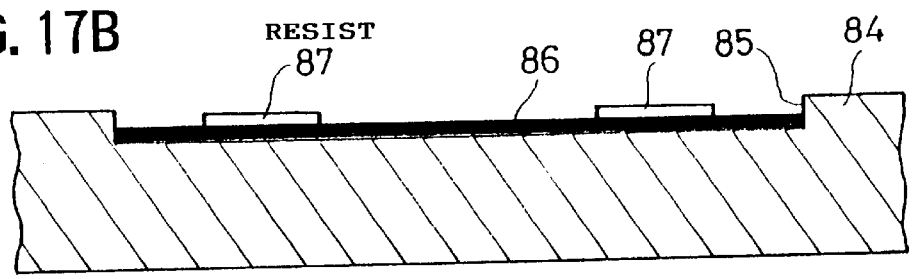
Figure 17C:
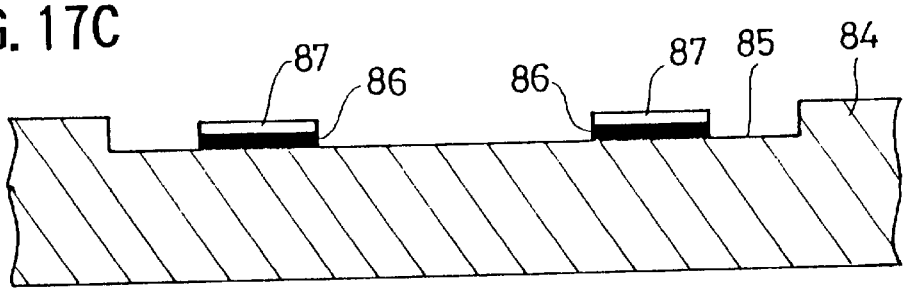
Figure 17D:
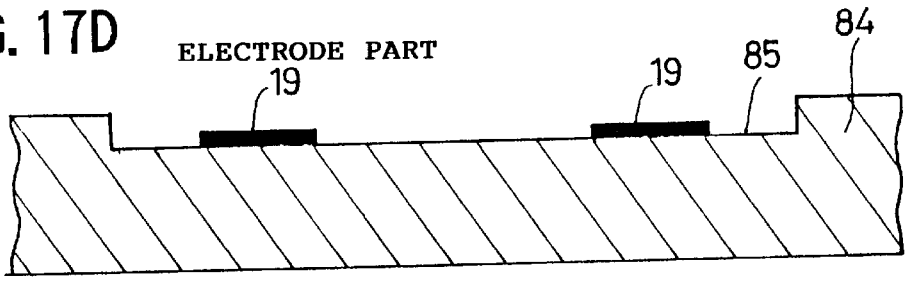

After the conductive layer 86 is formed in the dent 85, resist 87 is placed on areas where the electrode parts 19 are to be formed, as shown in FIG. 17B. Then, as shown in FIG. 17C, part of the conductive layer 86 which is not covered by the resist 87 is removed by an etching process. Then, the resist 87 is removed to create the electrode parts 19 in the dent 85, as shown in FIG. 17D.

Figure 17E:
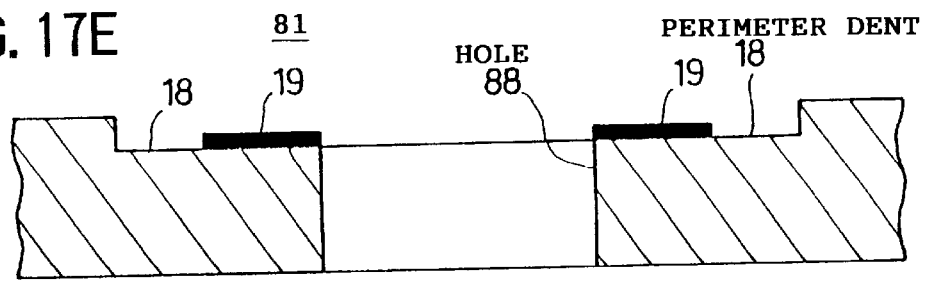

After the electrode parts 19 are formed, a hole 88 is formed through the plate board 18 at a position where the container part 17 is formed. This completes the top printed board single layer 81 as shown in FIG. 17E. The dent 85 formed on the upper surface of the plate board 84 turns into the perimeter dent 18 after the hole 88 is created.

Figure 18A:
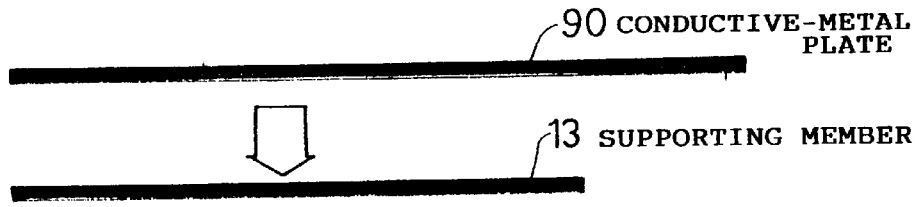
FIGS. 18A and 18B are process charts showing a process of forming another printed board single layer which is provided with a supporting member.
Figure 18B:
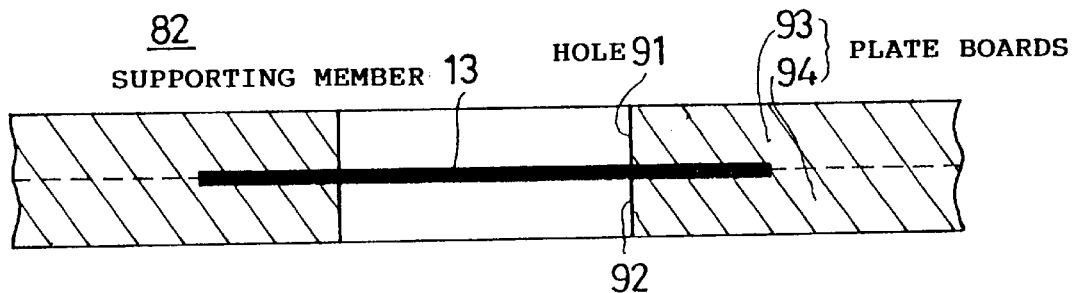

FIGS. 18A and 18B show a process of forming a middle printed board single layer 81.

As shown in FIG. 18A, a conductive-metal plate 90 is subject to a press process, for example, forming the die-pad portion 21 and the supporting bars 22 so as to form the supporting member 13. At this stage, the resin-pathway holes 27 are also created, which may have a varied shape as has been described with reference to FIGS. 6A to 6E.

Then, a pair of plate boards 93 and 94 are prepared. The plate boards 93 and 94 are made of glass-epoxy, epoxy, and have holes 91 and 92, respectively, at a location where the container part 17 is to be formed. As shown in FIG. 18B, the supporting member 13 is placed between the pair of plate boards 93 and 94. Then, a heat-pressing process is applied to the plate boards 93 and 94 and the supporting member 13, so that the middle printed board single layer 82 is created.

A bottom printed board single layer 83 can be created in the similar manner to the top printed board single layer 81. The only differences are in that the dent 85 is not created and the conductive layer is formed on a lower surface of the plate board. The conductive layer formed on the lower surface forms the external-connection pads 25 for the bottom printed board single layer 83. Thus, a process for forming the bottom printed board single layer 83 will not be described with reference to figures.

Figure 19A:
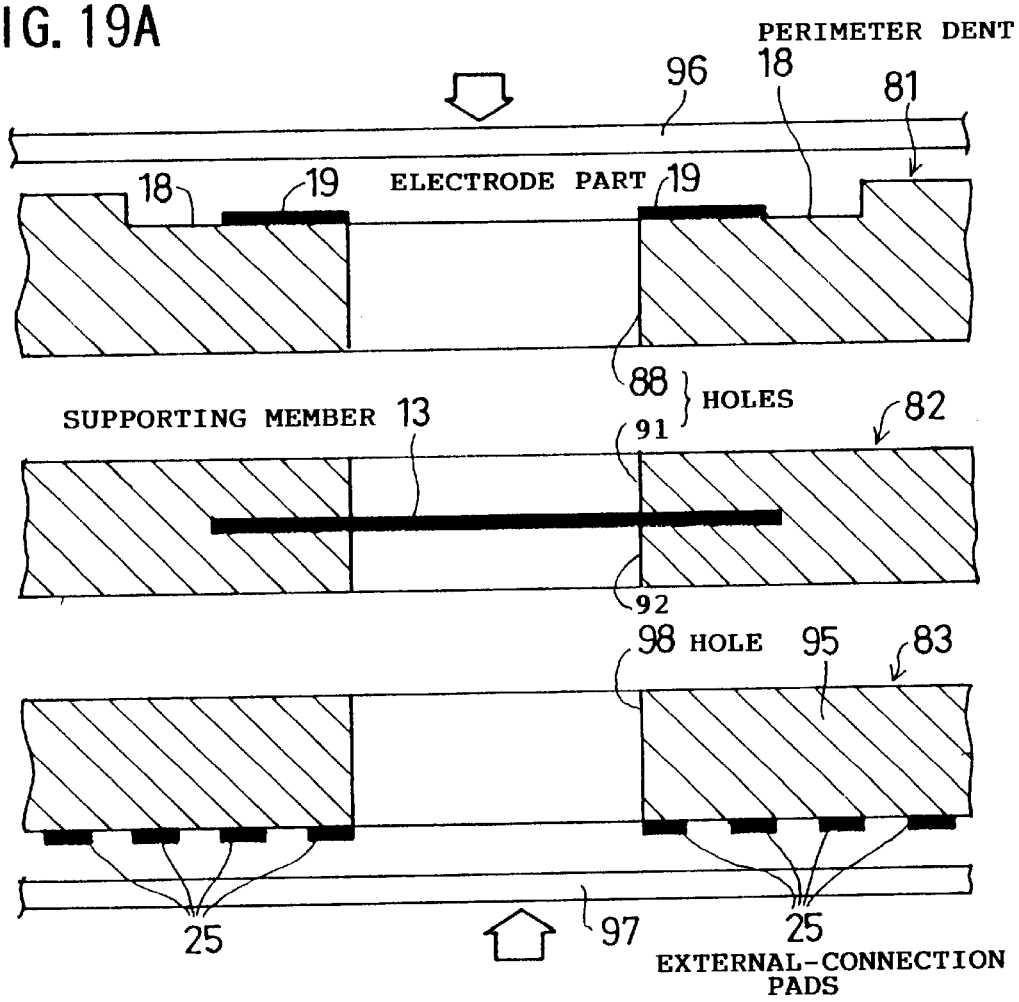

FIGS. 19A and 19B show a process of forming a multilayer printed board 100.

After the printed board single layers 81 to 83 are created, they are stacked one on another as shown in FIG. 19A. Then, fixtures 96 and 97 are used for pressing the printed board single layers 81 through 83 from the top and the bottom, respectively. While the fixtures 96 and 97 are pressed, heat is applied so as to connect the printed board single layers 81 through 83 together. Thus, the multilayer printed board 100 as shown in FIG. 19B is created.

The multilayer printed board 100 is comprised of the printed board single layers 81 through 83 fixed together such that the holes 88, 91, 92 and 93 are aligned to create the container part 17.

After the multilayer printed board 100 is created, the inside-wall wiring 41 are created.

FIGS. 20A and 20B show a process for forming the inside-wall wiring 41.

As shown in FIG. 20A, a plurality of the grooves 42 are formed on the inside wall of the container part 17. The grooves 42 may be formed by a cutting process and the like, and locations of the grooves 42 should coincide with the locations of the electrode parts 19 formed on the perimeter dent 18.

After the grooves 42 are formed on the inside wall of the container part 17, the conductive member 43 is formed in the grooves 42 as shown in FIG. 20B. The conductive member 43 may be formed from copper and the like by a sputtering method, a plating method, etc. The upper end of the conductive member 43 is connected with the electrode parts 19, and the lower end thereof is connected to the external-connection pads 25 (via a wiring pattern). As described here, the process for forming the inside-wall wiring 41 is a simple process of forming the grooves 42 and forming the conductive member 43 in the grooves 42. Thus, this process can be readily carried out.

The processes described above constitute a process of forming the multilayer printed board. When this process is finished, a process of mounting the semiconductor chip 12 on the multilayer printed board 11 is carried out.

Figure 21A:
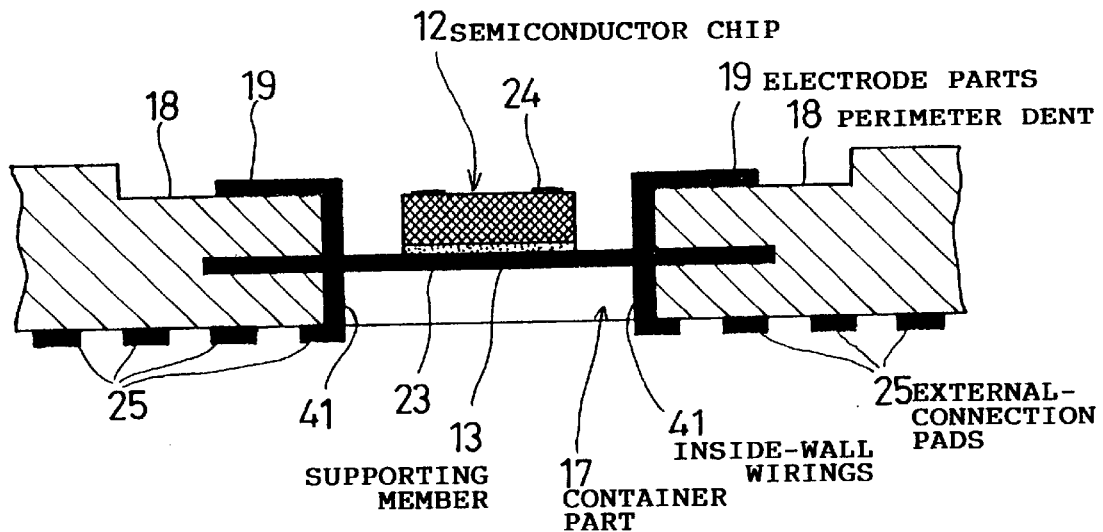
FIGS. 21A and 21B are process charts showing a process of mounting a semiconductor chip on the supporting member and a process of electrically connecting the semiconductor chip with electrode parts via wires.
Figure 21B:
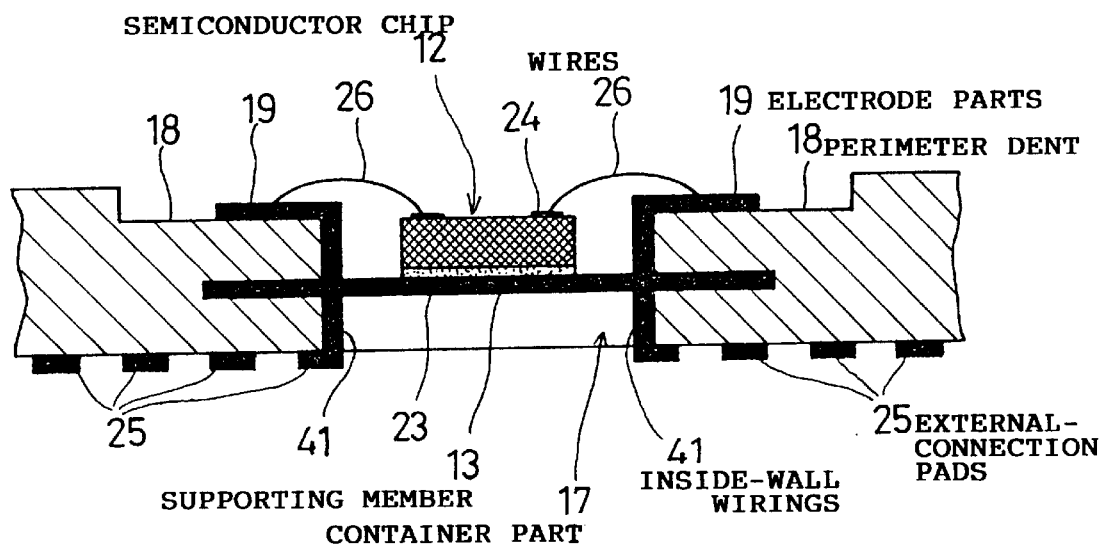

FIGS. 21A and 21B show processes of mounting the semiconductor chip and connecting the semiconductor chip with the electrode parts, respectively.

In order to mount the semiconductor chip 12 on to the multilayer printed board 11, the die-bonding material 23 such as a conductive resin (adhesive) is placed on the upper surface of the supporting member 13 held in the container part 17. Then, the semiconductor chip 12 is placed on the die-bonding material 23 so as to be fixed on the supporting member 13, as shown in FIG. 21A. In this positioning, electrode pads formed on a back surface of the semiconductor chip 12 are electrically connected with the supporting member 13 formed from a conductive metal.

After the semiconductor chip 12 is mounted on the supporting member 13, a wire-bonding process is applied to connect the electrode pads 24 formed on the semiconductor chip 12 with the electrode parts 19 formed on the multilayer printed board 11 via the wires 26, as shown in FIG. 21B. Here, the electrode parts 19 are formed in the perimeter dent 18 on the multilayer printed board 11, so that the electrode pads 24 and the electrode parts 19 are spatially close to each other. Thus, the wire-bonding process for the wires 26 can be readily carried out.

After the processes of mounting the semiconductor chip and connecting the semiconductor chip with the electrode parts are finished, a process of filling the sealing resin 15 into the multilayer printed board 11 so as to cover the semiconductor chip 12 is carried out.

Figure 22:
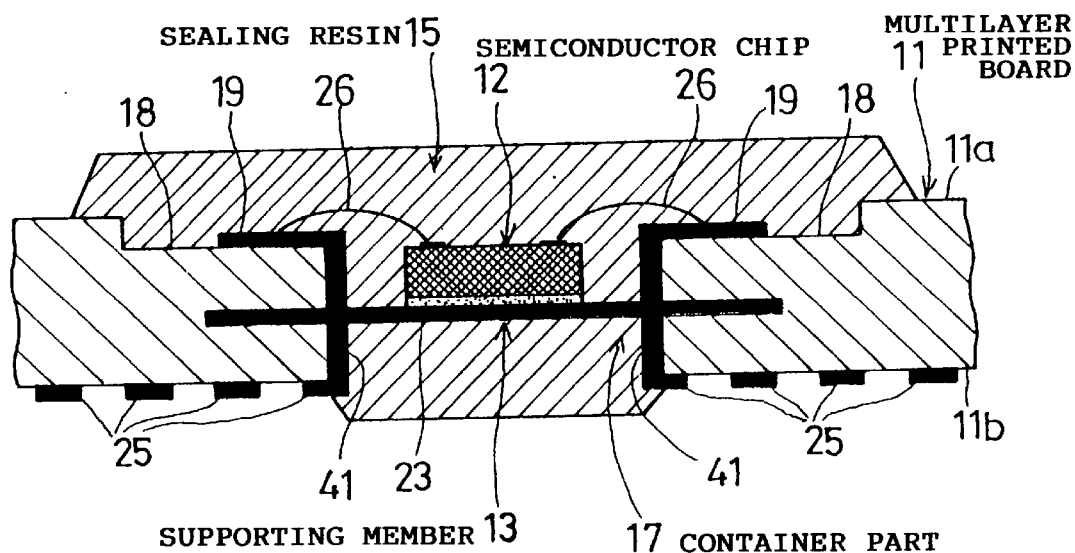
FIG. 22 is a cross-sectional view of the semiconductor device after the sealing resin is filled into a container part of the multilayer printed board.

FIG. 22 shows the semiconductor device after the process of filling the sealing resin 15.

Epoxy-resin is used as the sealing resin 15. The sealing resin 15 may be filled into the container part 17 of the multilayer printed board 11 by a potting method. Specifically, a resin which will become the sealing resin 15 is poured into the container part 17 from above.

As described earlier, the supporting member 13 is formed in such that the resin-pathway holes 27 are provided between the inside wall for the container part 17 and the die-pad portion 21. Thus, the resin poured from above can go through the resin-pathway holes 27 to get into the space on the back side of the supporting member 13. As a result, the sealing resin 15 is settled so as to fully cover the semiconductor chip 12.

In this manner, the sealing resin 15 fully covers the semiconductor chip 12 as well as part of the supporting member 13. Thus, even though there is a difference in the thermal-expansion coefficients between the multilayer printed board 11 and the sealing resin 15, the multilayer printed board 11 can be prevented from bending, as described earlier.

After the process of filling the sealing resin is finished, a process of providing the solder balls 14 on the mounting surface 11b of the multilayer printed board 11 is carried out. To this end, solder balls having an identical diameter are placed on the external-connection pads 25 formed on the mounting surface 11b of the multilayer printed board 11, and, then, heat is applied to fix the solder balls on to the external-connection pads 25. The present invention has been particularly described with regard to the use of the solder balls 14 as the external-connection nodes. However, pin-shaped members, instead of the solder balls 14, can be used as the external connection node. When the pin-shaped members are used as the external connection nodes, the pin-shaped members can be connected on to the external-connection pads 25 with solder.

Figure 23:
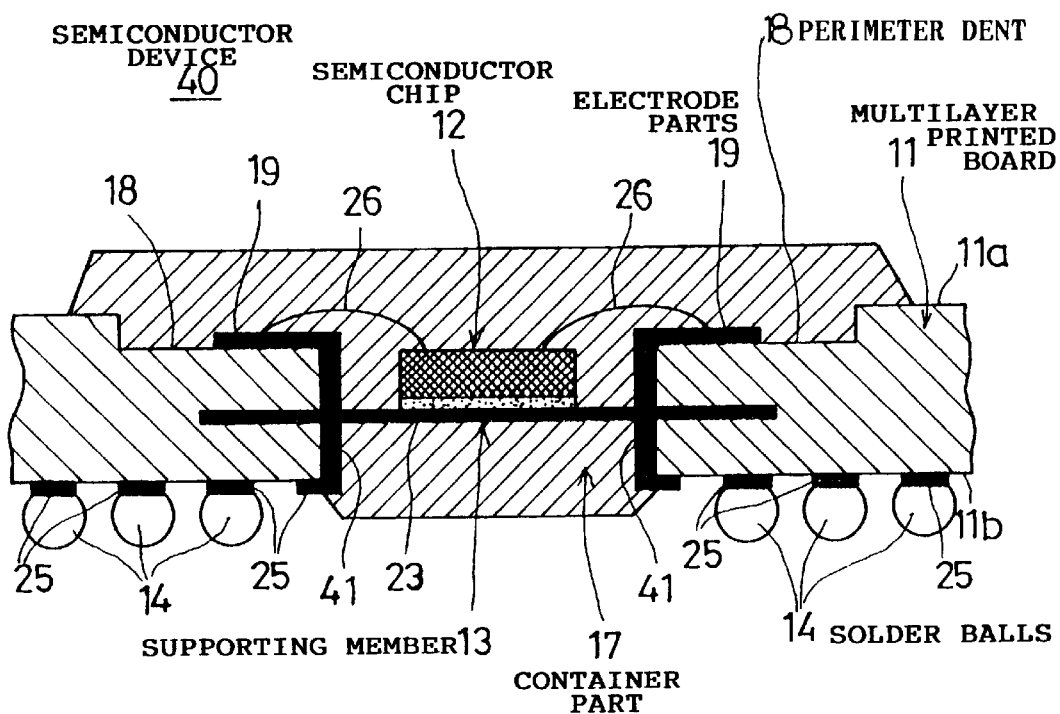
FIG. 23 is a cross-sectional view of the semiconductor device after solder balls are connected to external-connection nodes formed on a bottom surface of the multilayer printed board.

After the processes described above, the semiconductor device 40 shown in FIG. 23 is obtained. In the processes for forming the semiconductor device 40, the process of forming the multilayer printed board 11 can be carried out by forming the printed board single layers 81 to 83 having the holes at the location where the container part 17 is to be formed, by stacking the printed board single layers 81 to 83 with the supporting member 13 being inserted to a predetermined position, and by connecting the printed board single layers 81 to 83 together. Thus, the forming of container part 27 for housing the semiconductor chip 12 and the arrangement of the supporting member 13 can be readily carried out.

According to the present invention, the printed board is provided with the container part and the supporting member, so that the semiconductor chip can be housed in the container part and can be completely covered by the sealing resin. Thus, in this configuration, the sealing resin is not only provided on the surface of the printed board, but also provided in the container part.

Accordingly, when heat is applied to the semiconductor device, a stress caused by the difference in the thermal-expansion coefficients between the printed board and the sealing resin works as a force applied to the inside wall of the container part. That is, this stress may be a force with which the sealing resin presses the inside wall of the container part, or it may be a force which the sealing resin tries to break off from the inside wall of the container wall. In other words, this stress may be a force with which the inside wall of the container part presses the sealing resin, or may be a force with which the inside wall of the container part tries to break off from the sealing resin. Here, whether the stress is either a pulling force or a pushing force depends on the thermal-expansion coefficients of the printed board and the sealing resin and on whether the semiconductor device is either being heated or being cooled.

The stress caused by the difference in the thermal-expansion coefficients is applied in a direction parallel to the surface of the printed board, thus not generating a bending of the printed board. Thus, there is no force applied to the external-connection nodes to contract or elongate them in a vertical direction, so that the external-connection nodes can be kept at the same height at the time of manufacturing the semiconductor device. This results in the external-connection nodes being reliably secured on the assembly board.

Also, prevention of bending of the printed board means that cracks are not generated in the printed board or the sealing resin, and that the sealing resin does not break off from the printed board.

Also, according to the present invention, the container part is formed by creating the hole through the printed board, and, thus, can be readily made. In addition, the sealing resin can be provided not only on the upper surface of the printed board but also on the lower surface, thus providing a balance in the sealing resin arrangement. This adds to the measures for preventing bending of the printed board.

Furthermore, according to the present invention, the external-connection nodes are comprised of the solder balls, so that the semiconductor device can be readily implemented on the assembly board. In addition, since the solder balls are relatively inexpensive, the cost of the semiconductor device can be lowered.

Also, according to the present invention the printed board is comprised of the multilayer printed board, thus allowing the wiring to be implanted inside the printed board. This leads to the designing of the wires being easier, and, also, to the electrical pathways for connecting the semiconductor chip with the external-connection nodes being shortened. The shorter pathways can lower the inductance thereof. Thus, malfunctions otherwise generated by the interference between the wiring can be prevented.

Furthermore, according to the present invention, the supporting member is held in the container part by the supporting bars thereof which is implanted and fixed in the printed board. Thus, the supporting member can be readily mounted to the printed board.

Also, according to the present invention, the resin-pathway holes are created through the supporting member in order to allow the sealing resin to get into the space behind the supporting member. When the sealing resin is filled into the container part from above by the potting process, for example, the sealing resin is completely contained in the space behind the supporting member.

Furthermore, according to the present invention, the heat-releasing member is provided beneath the supporting member such that one surface of the heat-releasing member is in contact with the supporting member and the other surface is exposed to the air. Thus, heat generated by the semiconductor device can be released to the outside via the supporting member and the heat-releasing member, so that the cooling efficiency of the semiconductor device can be enhanced.

Also, according to the present invention, the supporting member is formed from a conductive metal, and the conductive layer connected with the supporting member is provided inside the multilayer printed board. Thus, the supporting member can serve as wiring, providing a wider scope for laying out the wiring.

Furthermore, according to the present invention, the inside-wall wiring is formed on the inside wall of the container part. This can shorten the paths connecting the semiconductor chip and the external-connection nodes, compared to the related art which should extend the wiring pattern to the perimeter of the printed board. The shorter pathways means that the inductance thereof is lowered, thus adding to an increase in the processing speed of the semiconductor device.

Also, according to the present invention, the inside-wall wiring includes the grooves formed on the inside wall of the container part and the conductive members provided in the grooves. Thus, the inside-wall wiring can be easily formed. Also, since the conductive members are arranged inside the grooves, the inside-wall wiring does not present any impediment for the flow of the sealing resin when it is filled into the container part.

Furthermore, according to the present invention, the perimeter dent is formed on the upper surface of the printed board around the container part, and the electrode parts connected with the semiconductor chip through the wires are provided in the perimeter dent. Thus, even though the semiconductor chip is held in the container part, the electrode parts are in a close proximity of the semiconductor chip. This allows the wire connection between the semiconductor chip and the electrode parts to be reliably made.

Also, according to the present invention, the sealing resin is provided to extend outwardly from the lower surface of the printed board as well as from the upper surface. This configuration of the sealing resin flanking the printed board on both the upper and lower sides can prevent the printed board from bending.

Furthermore, according to the present invention, the multilayer printed board is formed by first creating printed board single layers having a hole where the semiconductor chip is to be held. Then, the printed board single layers are stacked one on another with the supporting member being inserted to a predetermined position, and, then, are connected together. Thus, the container part for housing the semiconductor chip can be readily formed, and the supporting member can be arranged to an appropriate position without any difficulty.

Also, according to the present invention, the printed board single layers are stacked one over another with the supporting member being inserted to a predetermined position, and, then, are connected together. Then, a plurality of the grooves are formed on the inside wall of the container part which has been just created by stacking the printed board single layers, and the conductive members are provided inside the grooves. Thus, the inside-wall wiring can be readily made.

Further, the present invention is not limited to these embodiments, but various variations and modifications may be made without departing from the scope of the present invention.

What is claimed is:

1. A semiconductor device comprising:

a board having a lower surface;

a container part provided in said board as a hole formed through said board;

external-connection nodes provided on said lower surface of said board;

a supporting member having a first portion provided inside said container part and a second portion buried in said board, said supporting member having an upper surface and a lower surface;

a semiconductor chip secured on said supporting member which extends completely under said semiconductor chip, said semiconductor chip being electrically connected to said external-connection nodes; and a sealing resin fully filling said container part and completely covering said semiconductor chip and said upper and lower surfaces of said first portion of said supporting member.

2. The semiconductor device as claimed in claim 1, wherein said external-connection nodes comprise solder balls.

3. The semiconductor device as claimed in claim 1, wherein said board comprises a multilayer printed board.

4. The semiconductor device as claimed in claim 3, wherein said multilayer printed board further comprises internal wiring which electrically connects said semiconductor chip to said external-connection nodes.

5. The semiconductor device as claimed in claim 4, wherein said supporting member comprises a conductive metal and said multilayer printed board further comprises a conductive layer connected to said supporting member.

6. The semiconductor device as claimed in claim 1, wherein said supporting member further comprises supporting bars securely fixed to said board and said first portion.

7. The semiconductor device as claimed in claim 1, wherein said supporting member further comprises resin-pathway portions defined by holes through said supporting member, so that said sealing resin fills a space beneath said supporting member through said resin-pathway portions.

8. The semiconductor device as claimed in claim 1, further comprising inside-wall wiring formed on an inside wall of said container part, wherein said inside-wall wiring electrically connects said semiconductor chip with said external-connection nodes.

9. The semiconductor device as claimed in claim 1, further comprising electrode parts connected to said semiconductor chip via wires and to said external connection nodes, wherein said board further comprises a perimeter dent formed on an upper surface thereof around said container part and having a surface lower than said upper surface of said board, and said electrode parts are formed on said perimeter dent.

10. The semiconductor device as claimed in claim 1, wherein said sealing resin has a portion extending outwardly from an upper surface of said board and a portion extending outwardly from said lower surface of said board.

11. A semiconductor device comprising:

a board having a lower surface;

a container part provided in said board as a hole formed through said board;

external-connection nodes provided on said lower surface of said board;

a supporting member having a first portion provided inside said container part and a second portion buried in said board, said supporting member having an upper surface and a lower surface;

a semiconductor chip secured on said supporting member which extends completely under said semiconductor chip, said semiconductor chip being electrically connected to said external-connection nodes;

a sealing resin fully filling said container part and completely covering said semiconductor chip and said upper surface of said first portion of said supporting member; and a heat-releasing member having one surface in heat-conductive contact with said supporting member and having another surface exposed to ambient air.

12. The semiconductor device comprising:

a board having a lower surface;

a container part provided in said board as a hole formed through said board;

external-connection nodes provided on said lower surface of said board;

a supporting member having a first portion provided inside said container part and a second portion buried in said board, said supporting member having an upper surface and a lower surface;

a semiconductor chip secured on said supporting member which extends completely under said semiconductor chip, said semiconductor chip being electrically connected to said external-connection nodes;

a sealing resin fully filling said container part and completely covering said semiconductor chip and said upper and lower surfaces of said first portion of said supporting member, and inside-wall wiring formed on an inside wall of said container part, wherein said inside-wall wiring electrically connects said semiconductor chip with said external-connection nodes, wherein said inside-wall wiring comprises grooves formed on said inside wall and conductor members provided in said grooves.

* * * * *